(12) United States Patent
Kaczynski

(10) Patent No.: US 11,289,062 B2
(45) Date of Patent: Mar. 29, 2022

(54) FUNDAMENTAL FREQUENCY DETECTION USING PEAK DETECTORS WITH FREQUENCY-CONTROLLED DECAY TIME

(71) Applicant: Second Sound LLC, Miami, FL (US)

(72) Inventor: Brian James Kaczynski, Miami, FL (US)

(73) Assignee: SECOND SOUND, LLC, Miami, FL (US)

(*) Notice: Subject to any disclaimer, the term of this patent is extended or adjusted under 35 U.S.C. 154(b) by 0 days.

(21) Appl. No.: 17/297,645

(22) PCT Filed: Oct. 7, 2019

(86) PCT No.: PCT/US2019/055018
§ 371 (c)(1),
(2) Date: May 27, 2021

(87) PCT Pub. No.: WO2020/076713
PCT Pub. Date: Apr. 16, 2020

(65) Prior Publication Data
US 2021/0358464 A1 Nov. 18, 2021

Related U.S. Application Data

(63) Continuation of application No. 16/154,837, filed on Oct. 9, 2018, now abandoned.
(Continued)

(51) Int. Cl.
*G10H 5/00* (2006.01)
*G10H 5/04* (2006.01)
(Continued)

(52) U.S. Cl.
CPC .............. *G10H 5/002* (2013.01); *G10H 5/04* (2013.01); *H03L 7/087* (2013.01); *H03L 7/091* (2013.01);
(Continued)

(58) Field of Classification Search
CPC .......... G10H 5/002; G10H 5/04; H03L 7/097; H03L 7/087; H03L 7/0992; H03L 7/091; H03L 7/16
(Continued)

(56) References Cited

U.S. PATENT DOCUMENTS 3,866,127 A * 2/1975 Demos .................... H03B 19/00
377/46
3,919,648 A * 11/1975 Uetrecht ................ G10H 5/002
327/555
(Continued)

FOREIGN PATENT DOCUMENTS

GB 2218527 A * 11/1989 ............... G10G 7/02
GB 2218527 A 11/1989
(Continued)

*Primary Examiner* — Christina M Schreiber
(74) *Attorney, Agent, or Firm* — James Earl Lowe, Jr.

(57) ABSTRACT

Methods and digital circuits provide frequency correction to frequency synthesizers. Dual switched-capacitor voltage detectors connected to an input signal periodically sample the voltage of the input signal, and then determine a fundamental frequency of the input signal from the output of the dual switched-capacitor voltage detectors. The sample period of the dual switched-capacitor voltage detectors is proportional to a time period between a previous pair of voltage peaks detected in the input signal, thereby eliminating harmonic components in the original signal which might otherwise cause errors in frequency estimation without causing unwanted sluggishness in the transient response of the frequency detection process. The time period between the previous pair of detected voltage peaks is used to create a decay signal that initiates a capacitor decay time for each voltage detector. Two additional digital methods of extracting the fundamental frequency as well as an envelope of an analog audio signal are also described, one utilizing a sliding sample rate, and the other utilizing a fixed sample rate.

3 Claims, 19 Drawing Sheets

Related U.S. Application Data

(60) Provisional application No. 62/881,516, filed on Aug. 1, 2019.

(51) Int. Cl.
*H03L 7/097* (2006.01)
*H03L 7/087* (2006.01)
*H03L 7/099* (2006.01)
*H03L 7/091* (2006.01)
*H03L 7/16* (2006.01)

(52) U.S. Cl.
CPC ............ H03L 7/097 (2013.01); H03L 7/0992 (2013.01); H03L 7/16 (2013.01)

(58) Field of Classification Search
USPC .......................................... 84/672
See application file for complete search history.

(56) References Cited

U.S. PATENT DOCUMENTS

| | | | | |
|---|---|---|---|---|
| 4,038,897 A * | 8/1977 | Murray | ................. | G10H 1/181 84/722 |
| 4,127,824 A * | 11/1978 | Bennett, Jr. | .............. | H04B 1/06 327/45 |
| 4,162,461 A * | 7/1979 | Wallis | .................... | H03H 11/12 327/552 |
| 4,164,626 A * | 8/1979 | Fette | ....................... | G10L 25/93 704/208 |
| 4,273,023 A * | 6/1981 | Mercer | .................... | G10G 7/02 324/76.48 |
| 4,295,106 A * | 10/1981 | Kahn | ........................ | H03C 1/02 327/105 |
| 4,300,431 A * | 11/1981 | DeRocco | ............... | G10H 3/125 84/654 |
| 4,315,220 A * | 2/1982 | Findeisen | ............ | H03K 5/1532 324/103 P |
| 4,357,852 A * | 11/1982 | Suenaga | ................ | G10H 3/182 84/454 |
| 4,365,533 A * | 12/1982 | Clark, Jr. | ............... | G10H 1/057 84/682 |
| 4,452,079 A * | 6/1984 | Tiller | ........................ | G01P 3/48 324/160 |
| 4,457,203 A * | 7/1984 | Schoenberg | ............. | G10G 7/02 324/76.47 |
| 4,463,647 A * | 8/1984 | Luce | ......................... | G10H 1/02 84/684 |
| 4,498,031 A * | 2/1985 | Stupp | ................. | H05B 41/2828 315/210 |
| 4,503,745 A * | 3/1985 | Clark, Jr. | ................ | G10H 1/057 84/689 |
| 4,585,974 A * | 4/1986 | Stupp | ................. | H05B 41/2828 315/223 |
| 4,688,464 A * | 8/1987 | Gibson | ..................... | G10G 7/02 324/76.24 |
| 4,926,159 A * | 5/1990 | Bartlett | .................. | A62B 99/00 310/317 |
| 5,729,145 A * | 3/1998 | Blades | ................. | H02H 1/0015 324/536 |
| 6,236,274 B1* | 5/2001 | Liu | .......................... | H03F 3/217 330/302 |
| 6,788,120 B1* | 9/2004 | Nguyen | ................ | H03K 5/1565 327/172 |
| 6,868,348 B1* | 3/2005 | Stoutenburg | ........... | G01M 7/025 702/56 |
| 8,102,216 B1* | 1/2012 | Kaczynski | ............ | H03B 5/1228 331/117 FE |
| 9,685,964 B1 | 6/2017 | Kaczynski | .............. | H03L 7/113 |
| 9,824,673 B2* | 11/2017 | Kaczynski | .............. | H03L 7/181 |
| 2004/0066593 A1* | 4/2004 | Kolker | .................... | G01R 31/52 361/42 |
| 2004/0124875 A1* | 7/2004 | Dabral | ............... | H03K 19/1732 326/38 |
| 2008/0232526 A1* | 9/2008 | Kaczynski | ................ | H03L 7/00 375/362 |
| 2008/0272810 A1* | 11/2008 | Edwards | ................. | H03L 7/18 327/156 |
| 2011/0299704 A1* | 12/2011 | Kaczynski | ............... | H04S 1/007 381/98 |
| 2016/0134312 A1* | 5/2016 | Kaczynski | ............... | H03H 7/25 455/249.1 |
| 2017/0287458 A1* | 10/2017 | Kaczynski | ............... | H03L 7/197 |
| 2018/0131356 A1* | 5/2018 | Karmaker | ............... | H03K 5/153 |
| 2020/0111469 A1* | 4/2020 | Kaczynski | ............... | H03L 7/0992 |
| 2020/0111470 A1* | 4/2020 | Kaczynski | ............... | G10H 5/002 |
| 2021/0358464 A1* | 11/2021 | Kaczynski | ............... | H03L 7/0992 |

FOREIGN PATENT DOCUMENTS

| | | | | |
|---|---|---|---|---|
| WO | 90/13890 A1 | 11/1990 | | |
| WO | WO-9013890 A1 * | 11/1990 | ............. | G10L 25/00 |

* cited by examiner

FUNDAMENTAL FREQUENCY DETECTION USING PEAK DETECTORS WITH FREQUENCY-CONTROLLED DECAY TIME

This application claims priority to and the benefit of U.S. Provisional Application No. 62/881,516 filed 1 Aug. 2019. This application is also a Continuation-In-Part of and claims priority to and the benefit of US Full Utility Application No. 16154837 filed 9 Oct. 2018.

BACKGROUND

This disclosure is directed to a method of detecting an audio signal fundamental frequency without filtering the input signal in order to achieve a minimum possible physically achievable latency of one audio cycle.

The fast-locking frequency synthesizer presented and in U.S. Pat. No. 9,685,964 works well for musical signals which don't possess strong harmonic components. With the addition of the disclosure described in U.S. Pat. No. 9,824,673 (a CIP filing based on the previously mentioned U.S. Pat. No. 9,685,964), it is possible to filter harmonics of the fundamental and improve frequency tracking for more complex musical signals. However, the transient response of the filter described in U.S. Pat. No. 9,824,673 causes audible latency, especially for bass instruments in the 20-80 Hz range. A method of detecting fundamental frequency without filtering the input signal is desired in order to achieve the minimum possible physically achievable latency of one audio cycle.

SUMMARY

In order to mitigate synthesizer locking to harmonics of a fundamental frequency of an input signal, a new method is described which uses dual peak detectors operating on the audio signal and its inverse. The decay time constant of these peak detectors is made proportional to a time period between a previous pair of voltage peaks detected in the input signal, thereby eliminating harmonic components in the original signal which might otherwise cause errors in frequency estimation. This is done without causing unwanted sluggishness in the transient response of the frequency detection process. The time period between the current and previous detected voltage peaks is used to adjust the decay time constant on the next cycle, ensuring a rapid convergence to steady-state behavior where the period between successive moments when the audio signal crosses the decaying peak corresponds to the precise fundamental period of the audio signal.

Three implementations are disclosed herein of dual peak detectors with frequency-controlled decay time that isolate the fundamental frequency in a music signal to avoid false zero crossings and the errors in frequency tracking caused as a result.

The first implementation uses dual switched-capacitor peak detectors, connected to the input signal and its inverse, which periodically sample the voltage of the signal (or its inverse) when it is larger than the peak, and which decay with some time constant when the input signal (or its inverse) falls below the decaying peaks. The time period between peaks is thus measured and the frequency of a digitally controlled oscillator in a frequency-locked loop is adjusted to output a clock CKDCO which will complete 8,192 cycles in the amount of time corresponding to that previously measured period. This clock is then used to sample the switched-capacitor peak detectors. This arrangement results in the peak detectors having decay time which remains proportional to the fundamental period of the audio signal, no matter its frequency.

The second implementation uses the CKDCO clock operating at 8,192 times the fundamental frequency of the audio signal to clock an analog-to-digital converter (ADC) to convert the analog audio signal to a digital representation with sample rate proportional to the fundamental frequency of the audio. Depending on the type of ADC chosen, number of bits, and the speed of the semiconductor process chosen for the implementation, it may be advisable to divide the CKDCO signal down by a factor of two. A compromise should be found between choosing a frequency HIGH enough to avoid aliasing when the input frequency is low and choosing a frequency LOW enough so that the ADC has time to convert the audio input to digital when the input frequency is high. After the signal is digitized, it may be processed using standard digital gates such as adders, flip-flops and logic gates to achieve substantially the exact same peak detector behavior as described in the first implementation.

The third implementation uses a fixed sampling rate such as the ubiquitous (for audio) 48 KS/s or 96 KS/s rates to digitize the audio signal and digital processing and together with a state machine to emulate the "sliding" sample rate behavior of the analog or digital dual peak detector implementations described above.

These implementations are mentioned not to limit or define the scope of the disclosure, but to provide an example of an implementation of the disclosure to aid in understanding thereof. Particular implementations may be developed to realize one or more of the following advantages.

BRIEF DESCRIPTION OF THE DRAWINGS

The details of one or more implementations are set forth in the accompanying drawings and the description below. Other features, aspects, and advantages of the disclosure will become apparent from the description, the drawings, and the claims, in which:

Like reference numbers and designations in the various drawings indicate like elements.

Figure 1:
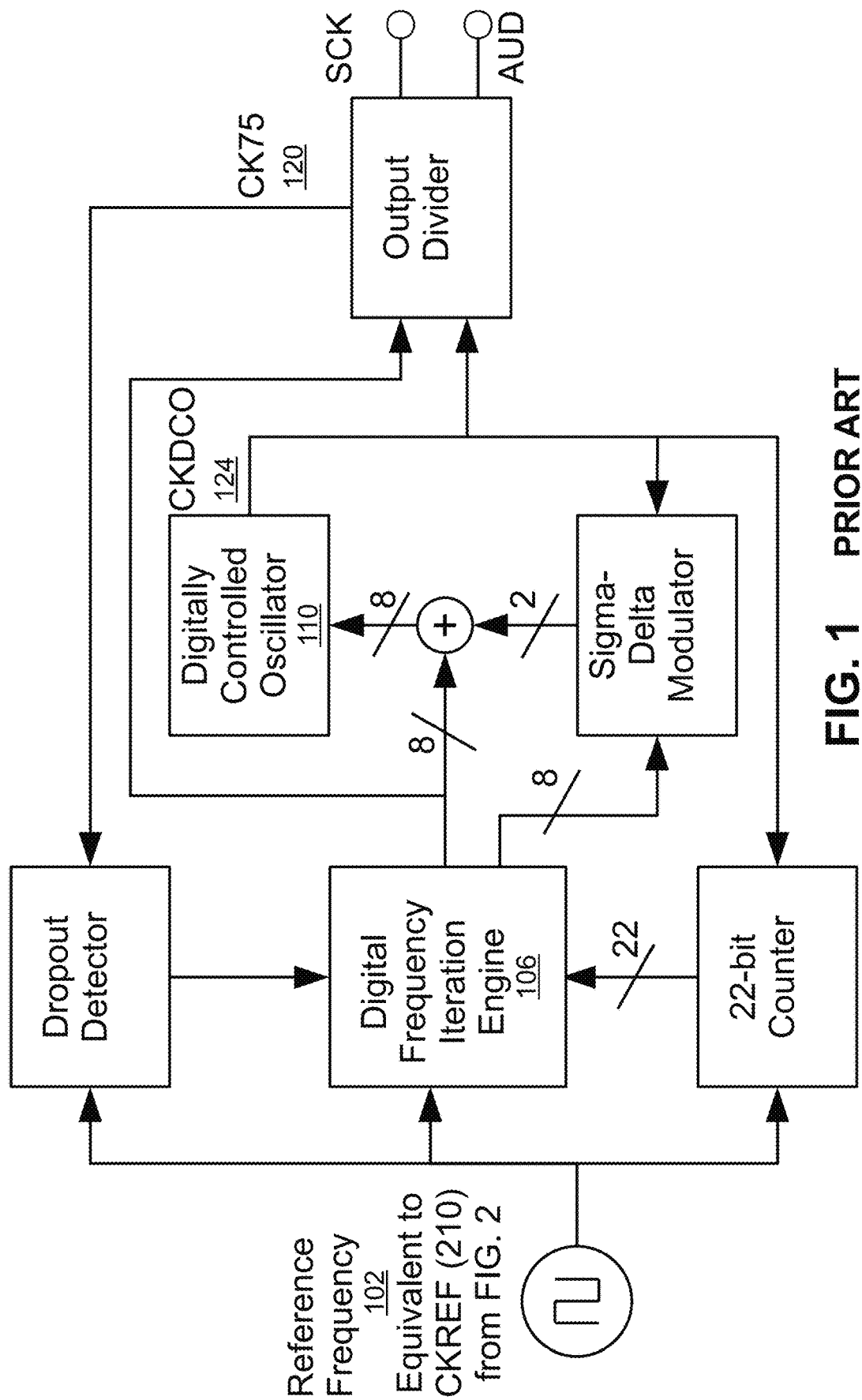
FIG. 1 is a block diagram of the frequency-locked loop system described in U.S. Pat. No. 9,685,964, where the Reference Frequency 102 will be generated by the disclosure described herein and the output of the Digitally Controlled Oscillator (DCO) 110 is called CKDCO.

Before one embodiment of the disclosure is explained in detail, it is to be understood that the disclosure is not limited in its application to the details of the construction and the arrangements of components set forth in the following description or illustrated in the drawings. The disclosure is capable of other embodiments and of being practiced or being carried out in various ways. Also, it is to be understood that the phraseology and terminology used herein is for the purpose of description and should not be regarded as limiting. Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

DETAILED DESCRIPTION

Numerous specific details may be set forth below to provide a thorough understanding of concepts underlying the described implementations. It may be apparent, however, to one skilled in the art that the described implementations may be practiced without some or all of these specific details. In other instances, some process steps have not been described in detail in order to avoid unnecessarily obscuring the underlying concept.

In any synthesizer which tracks the fundamental input frequency of a musical signal, from a voice or any instrument, including but not limited to electric guitar, bass guitar, brass, woodwinds, bowed strings, percussion, it is of crucial important to correctly identify the fundamental frequency in that signal. Often the second, third, or higher harmonics are larger in amplitude than the fundamental and create spurious zero crossings which persist even after low-pass filtering, which make detection based on filtering and detecting zero crossings problematic. Because the "musically useful" frequency range of all instruments covers about 8 octaves, a method is desired whose transient behavior properly scales with the input frequency. Adaptive filters such as the one described in U.S. Pat. No. 9,824,673 are also problematic as they noticeably slow down the transient response of the fundamental frequency detection, especially for signals in the bass range (20-100 Hz).

The fast-locking frequency synthesizer ("FLL") described in U.S. Pat. No. 9,685,964, which is incorporated herein by reference in its entirety, is illustrated in FIG. 1. The present disclosure concerns the generation of the Reference Frequency signal 102, illustrated in FIG. 1 as one cycle of a square wave, or more generally, in the extraction of the fundamental frequency contained in the incoming audio signal. In practice musical signals are much more complex than a square wave and require special care for detecting their fundamental frequency. The FLL is a frequency-locked loop circuit comprising a digitally controlled oscillator 110 configured to generate a first frequency; and a digital frequency iteration engine 106. The digital frequency iteration engine 106 comprises a first circuit configured to receive the first frequency and a reference frequency and generate a number of first frequency cycles in one reference frequency cycle. The digital frequency iteration engine 106 also includes a second circuit configured to receive the number of first frequency cycles and generate a second frequency based on a predetermined frequency multiplication factor. The determined number of first frequency cycles, the first frequency, and the reference frequency, provides a predetermined frequency multiplication factor that provides a target relationship between the first frequency and the reference frequency.

Figure 2:
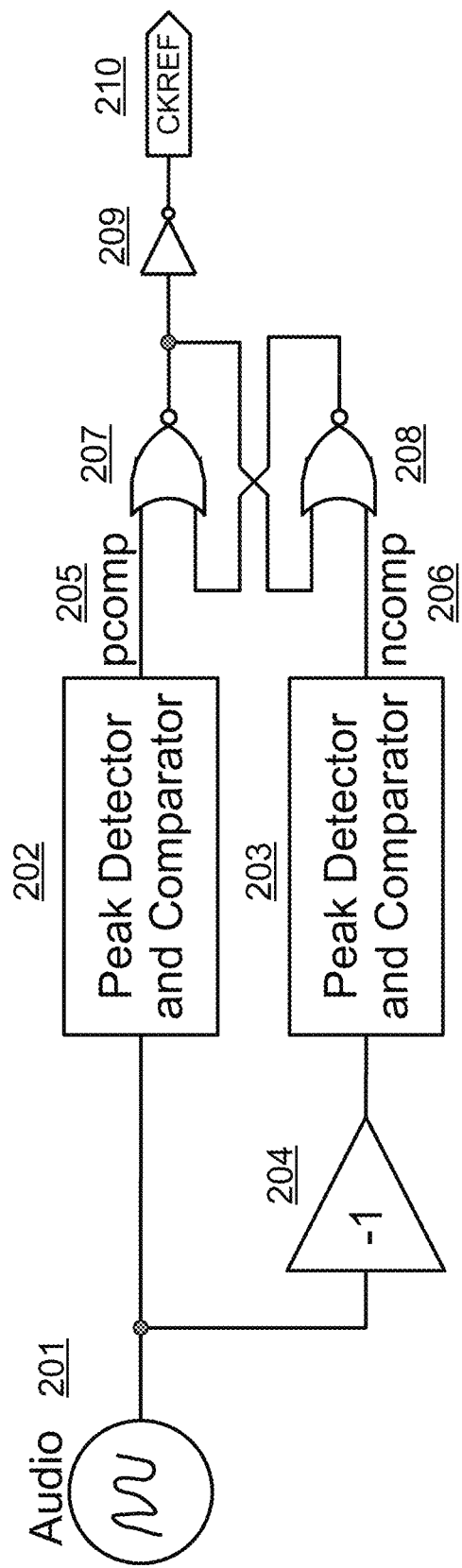
FIG. 2 is a block diagram of the fundamental frequency detection circuit comprised of two peak detectors, one of which has an inverting amplifier in front of it, and logic gates implementing an SR latch, where signal CKREF 210 serves as the Reference Frequency 102 input in the larger system.

The first embodiment of the present disclosure is illustrated in FIG. 2. It consists of two peak detectors and comparators, one driven by an audio input signal 201 and another driven by an inverted version of this audio signal produced with an inverting amplifier (or virtual inversion using a differential signaling) 204. In practice, the circuits shown here and in subsequent figures can be implemented as differential rather than single-ended circuits, although the single-ended versions of these circuits are shown in the figures for simplicity. With differential circuits, no amplifier is needed for an inversion, which can be achieved simply by swapping the positive and negative polarity signals.

The two peak detectors 202 and 203 are connected to the input signal 201 to periodically sample the voltage of the input signal 201 to create two comparator outputs, pcomp and ncomp (205 and 206). These comparator outputs are followed by an SR (Set/Reset) latch composed of cross-coupled NOR gates 207 and 208, with NOR gate 207 followed by inverter 209 to generate the reference clock signal CKREF (210) of the correct polarity. Note that if the polarity of the comparator outputs is reversed, the NOR gates can be replaced by NAND gates with no difference in functionality. The details of how this circuit functions as a fundamental frequency detector are hidden in the inner workings of the peak detector and comparator, which will be described next.

Figure 3:
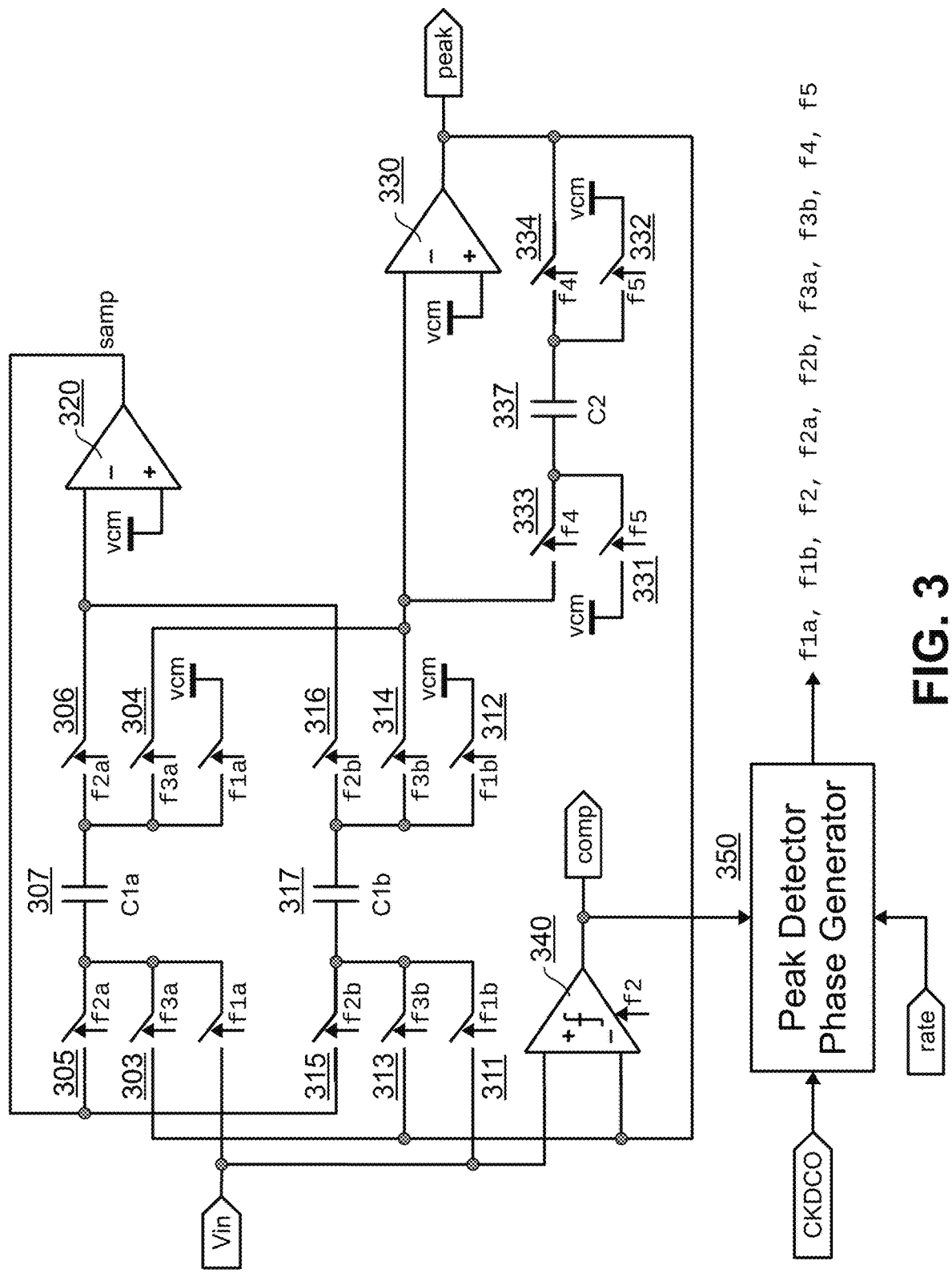
FIG. 3 is one embodiment of a switched-capacitor peak detector with decay time proportional to the detected fundamental frequency.

FIG. 3 shows the details of the peak detector and comparator implementation. The peak detector consists of two identical switched capacitor networks, each containing one capacitor C1a/C1b (or pair of capacitors in the case of differential signaling) and 6 switches for each capacitor, two op amps, a third switched capacitor network containing a different capacitor C2 and four switches, a comparator, and a digital phase generator circuit. As stated earlier, for simplicity the single-ended version of this circuit is shown in the figures and described herein, although in practice a differential version may be preferable for performance reasons.

Op amp 320 serves as a sample-and-hold amplifier (with output samp) and op amp 330 serves as a peak hold amplifier (with output peak). The CKDCO signal which serves as the input to peak detector phase generator 350 is the same as signal 124 in FIG. 1, the output of the digitally controlled oscillator 110. In the implementation described in U.S. Pat. No. 9,685,964, this digitally controlled oscillator generates a square wave whose frequency is 8,192 times the frequency presented at the input as the reference frequency 102. This CKDCO serves as the sample clock for the switched capacitor circuits described herein. In particular, the sample-and-hold circuit samples the audio input at 8,192 times the detected fundamental frequency. This ensures that even when the FLL is not yet locked to the fundamental of the audio, the system is still sampling the audio with high enough resolution to avoid even the remotest possibility of aliasing.

The working of the peak detector can be understood as follows. Each of two capacitors C1a and C1b (307 and 317) can be connected in three ways: (1) between the audio input Vin and a reference voltage vcm if φ1a or φ1b are high; (2) between the inverting input and output of op amp 320 (the sample-and-hold op amp) if φ2a or φ2b are high; and (3) between the inverting input and output of op amp 330 (the peak hold op amp) if φ3a or φ3b are high. On a given positive phase (let's call it phase a) of CKDCO (when φ1a or φ1b are high), the audio input is sampled onto EITHER capacitor C1a (307) OR capacitor C1b (317) (whose values are identical), depending on the state of φ3a. At the end of the input sample phase, when the audio input voltage has fully settled on the input capacitor C1a or C1b, the audio input voltage is compared to the peak hold output (as illustrated by the φ2 signal clocking comparator 340). During the negative phase of CKDCO (call it anti-phase a), the comparator 340 is given time to settle and the voltage sampled onto C1a or C1b is transferred to the sample-and-hold amplifier 320 via switch network 305/306 or 315/316. On the NEXT positive phase of CKDCO (phase b), the comparator result is utilized as follows: If the audio input sampled on the previous phase is larger than the current voltage on the peak output, the capacitor C1a or C1b whose voltage is being held by the sample-and-hold amplifier 320 is transferred to the peak hold amplifier 330 by opening switch pair 305/306 or 315/316 and closing switch pair 303/304 or 313/314, respectively. At the same time, the active sampling capacitor which is used to sample the audio input is swapped between C1a and C1b. In other words, if the peak hold amplifier voltage is held by C1a, capacitor C1b and switch network 311/312 will be used to sample the audio input on phase b.

In this way, it should be clear that if the input signal is rising continuously, the audio sampling will alternate between capacitors C1a and C1b on alternate cycles, with the peak signal constantly being updated by the currently sampled audio input. Conversely, if the audio input is smaller than the current peak signal, the capacitor holding the peak voltage (C1a or C1b) will remain in feedback around peak hold amplifier 330 and the input voltage will be sampled on the other capacitor (C1b or C1a) until such time as the input voltage will exceed the held peak voltage. The behavior of the clock phases φ1a/φ1b/φ2a/φ2b/φ3a/φ3b and operation of the peak detector will be more apparent when the details of the peak detector phase generator are shown and described below.

No peak detector would be complete without some kind of decay function to bleed the voltage level of the peak downward so that the peak detector can continue to detect peaks even when they are at equal or slightly lower amplitude than the previous peak. This is achieved in the current implementation by capacitor C2 (337) whose value is generally smaller than the values of C1a and C1b and a switch network consisting of four switches 331/332/333/334. Ordinarily switches 331 and 332 are closed (φ5 is high) and capacitor 337 is shorted out (both sides connected to reference voltage vcm). However, the CKDCO cycles are counted and every time a certain number of cycles elapse, the switches 331/332 open and switches 333/334 close, causing the peak voltage held by capacitor C1a or C1b to be attenuated by the charge sharing that takes place when the larger capacitor holding the peak voltage is shorted to a smaller capacitor discharged to zero volts. In the current implementation C2 is 55 times smaller than C1a/C1b; however, this value is arbitrary and almost any ratio of C2 to C1a/C1b should be considered to be within the scope of this disclosure.

It will be apparent to one skilled in the art that implementing the peak decay in this way, with a switched capacitor which is shorted across the peak detector output every time a certain number of CKDCO cycles elapse, creates a frequency-dependent decay time. This method determines a fundamental frequency of the input signal from the output of the dual switched-capacitor voltage detectors, the sample period of the dual switched-capacitor voltage detectors being proportional to a time period between a previous pair of voltage peaks detected in the input signal. In particular, when the FLL is locked, the peak decay over one audio cycle will be the same regardless of the audio frequency. This frequency-controlled decay time is the heart of the current disclosure and is exactly what enables it to function over an arbitrarily large range of input frequencies.

Figure 4A:
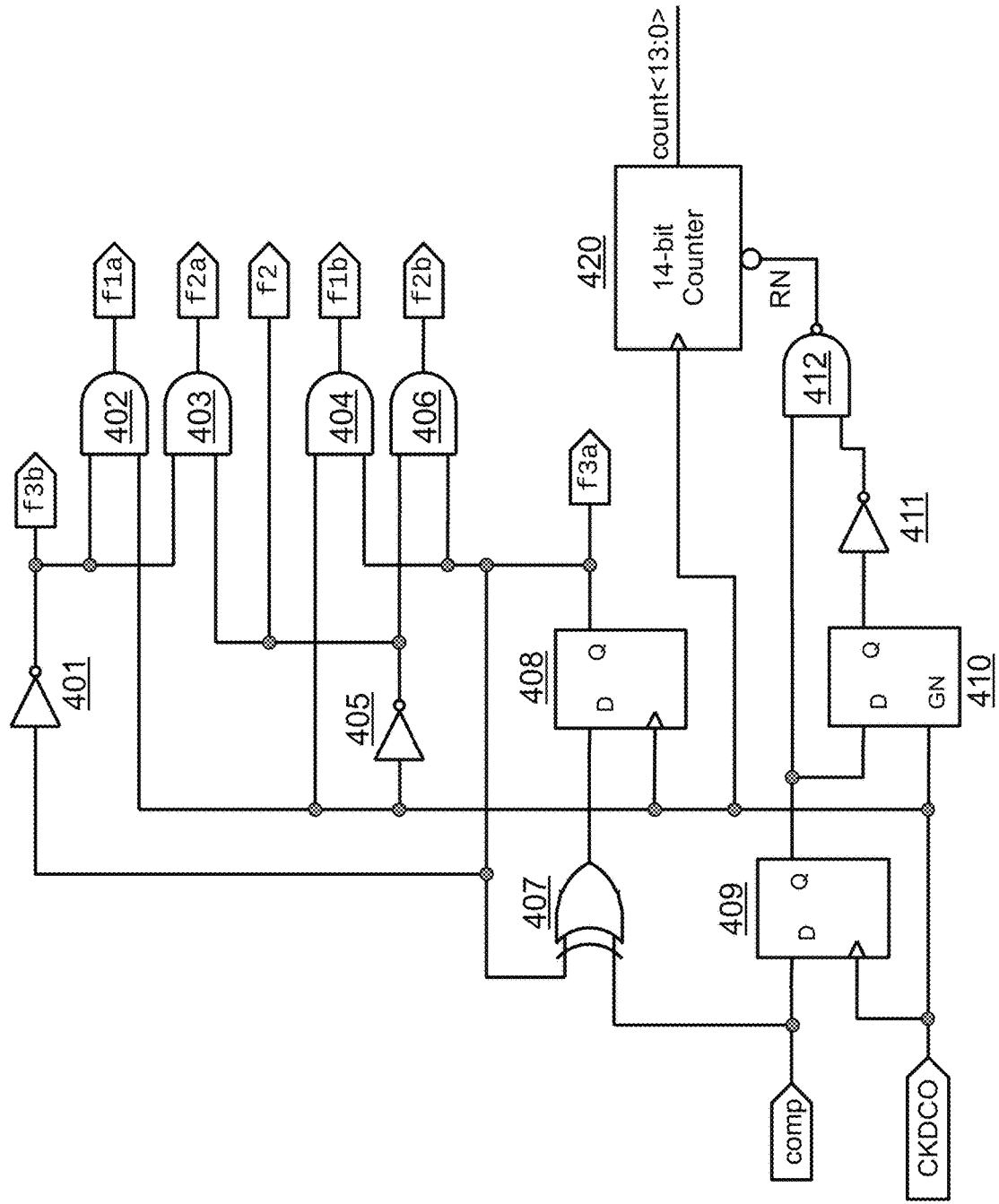
FIG. 4a is a simplified schematic diagram of the switched-capacitor peak detector phase generator 350.
Figure 4B:
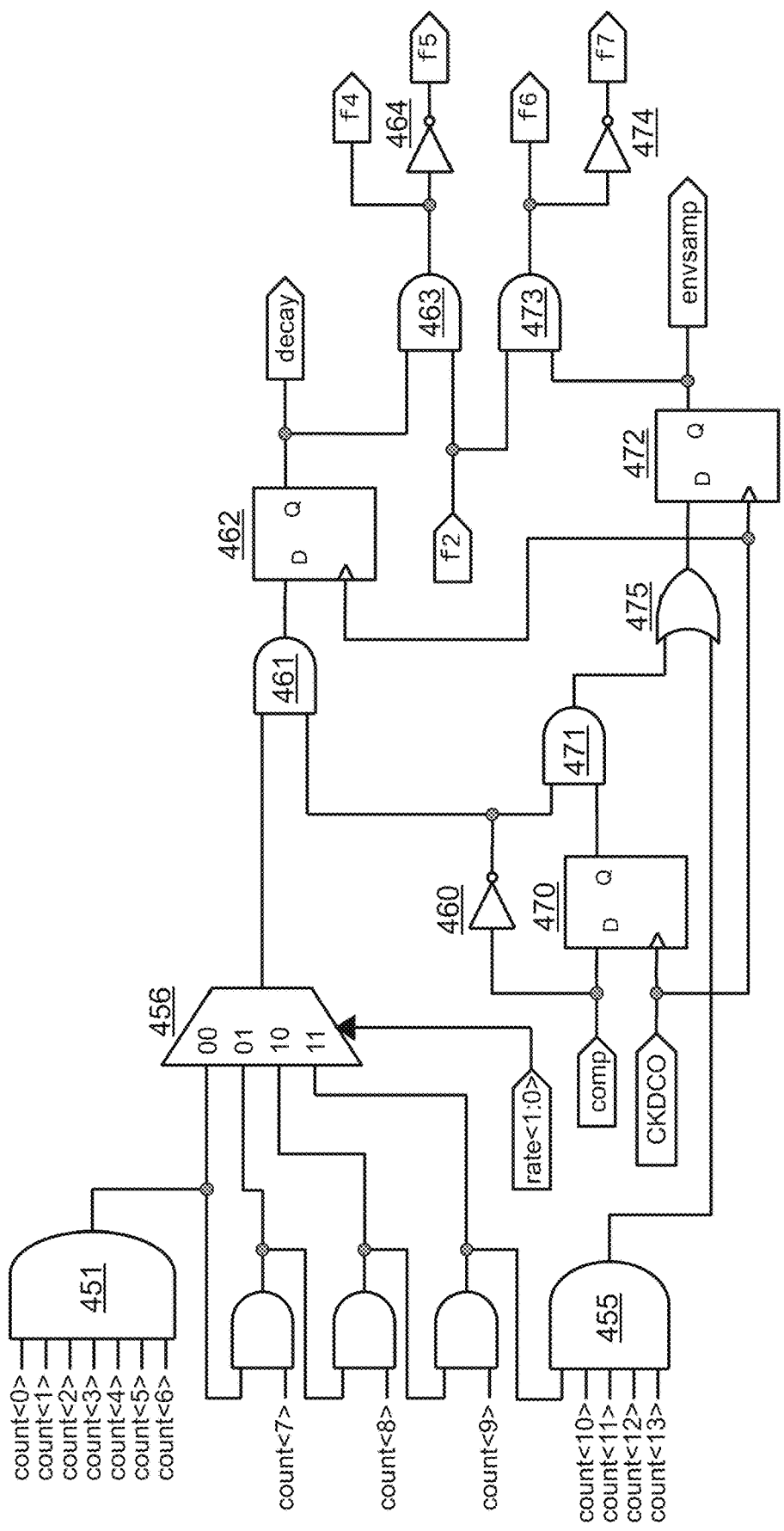
FIG. 4b is a continuation of the schematic diagram of the switched-capacitor peak detector phase generator in which the generation of phases φ4, φ5, φ6, and φ7 is illustrated.

FIG. 4a and FIG. 4b are simplified schematics of the peak detector phase generator 350. Note that all phases are controlled by non-overlapping phase generators which ensure that no two pair of switches are closed simultaneously, even for a very short period of time. Non-overlapping phase generators are well known in the art of switched capacitor circuits and aren't shown explicitly in the present disclosure, although it should be understood that they should be used to achieve the best possible performance. The peak detector phase generator operation can be understood as follows. The heart of the phase generator is XOR gate 407 and D flip-flop 408. The Q output of D flip-flop 408 serves as the φ3a phase, which is inverted via invertor 401 to generate φ3b. The output from comparator 340 "comp" is connected to one input of XOR gate 407 and the other input of this XOR gate is driven from the Q output of D flip-flop 408. The output of XOR gate 407 serves as the D input of flip-flop 408. In this way, if the comparator output "comp" is low, meaning that the audio input is smaller than the currently held peak value, D flip-flop 408 HOLDS its current state, meaning φ3a and φ3b remain as they are and the capacitor currently holding the peak value across peak hold op amp 330 remains connected there. Conversely, if the comparator output "comp" is high, meaning that the audio input is larger than the currently held peak value, the state held by D flip-flop 408 will change, causing the capacitor holding the current peak to be REPLACED by the capacitor holding the new (larger) peak.

The remaining pieces in FIG. 4a are simple enough to describe. AND gates 402 and 403 turn off phases φ1a and φ2a when φ3a is high and φ3b low (meaning C1b is sampling the audio input), and AND gates 404 and 406 turn off phases φ1b and φ2b when φ3b is high and φ3a low (meaning C1a is sampling the audio input). Inverter 405 inverts the CKDCO input to create the anti-phase clock signal φ2, whose positive edge clocks comparator 340. Additionally, there is a 14-bit counter 420, which generates a count<13:0> signal from which phases φ4 and φ5, which implement the frequency-dependent peak decay, are derived. The 14-bit counter 420 is reset every time a positive edge is detected on the "comp" input. The positive edge on "comp" is detected by latching the "comp" signal with D flip-flop 409 and then delaying the resulting signal by ½ of a CKDCO cycle with transparent latch 410 (with the clock input labeled "GN"). This transparent latch is transparent when the gate input "GN" is low and holds the value at the D input when the "GN" input goes high. The outputs of transparent latch 410 and D flip-flop 409 are combined with inverter 411 and NAND gate 412 to generate an active-low reset pulse for the 14-bit counter 420 which is ½ CKDCO cycle wide. This means the counter for generating the peak decay phases starts from zero every time an edge on the input signal is detected (that is, every time the comparator changes state from low to high).

FIG. 4b shows further details of the peak detector phase generator. In particular, the count<13:0> output of 14-bit counter 420 is used to generate periodic pulses on the φ4 output which short the peak decay capacitor C2 between the output and inverting input of peak hold op amp 330 which implement the frequency-dependent decay time. This is achieved as follows: There are four peak detector decay periods implemented in the current disclosure selected by a two-bit signal called rate<1:0>. If rate<1:0> is 00, the four-input MUX 456 in connection with 7-input AND gate 451 selects the pulse generated when count<0> through count<6> are all high. This occurs every 128 cycles of CKDCO, or 64 times per audio cycle (since there are 8,192 cycles of CKDCO in every audio cycle when the FLL is locked). If the "comp" signal is LOW, inverter 460 converts this to a high signal and AND gate 461 then allows this pulse to pass to the D input of D flip-flop 462. This pulse is delayed by one CKDCO cycle and then via AND gate 463 and inverter 464, creates a positive pulse on φ4 and negative pulse on φ5, connecting the peak decay capacitor C2 (337) in such a way to cause one step of decay in the held peak voltage. If the ratio of C2 to C1a/C1b is 55 as in the current disclosure, the new peak value will be 55/56 times the previous peak value. If the peak decay occurs 64 times in one cycle, as it will if the rate<1:0> signal is 00, the peak will decay to $(55/56)^{64}=0.315$ times its original value by the time the next peak occurs.

It will be apparent to one skilled in the art that utilizing peak detectors with decay time controlled by the frequency in this way, to detect the fundamental frequency of a signal, makes this detection method immune to errors caused by zero crossings caused by higher harmonics in the signal, as long as the amplitude from those higher harmonics does not instantaneously exceed the decaying peak amount during one cycle. To account for signals with stronger harmonic content, the rate<1:0> input can be increased. FIG. 4b shows how increasing the rate to 01 causes 4-input MUX 456 to generate a positive pulse when count<7> is also high in addition to count<0> through count<6>; if rate<1:0> equals 10, count <8> must also be high in addition to count <0> thought count<7>; and if rate<1:0> equals 11, count <9> must also be high in addition to count<0> though count<8>. As a result, the peak decays every 64, 32, 16, or 8 cycles when the rate is 00, 01, 10, or 11, respectively.

Figure 5:
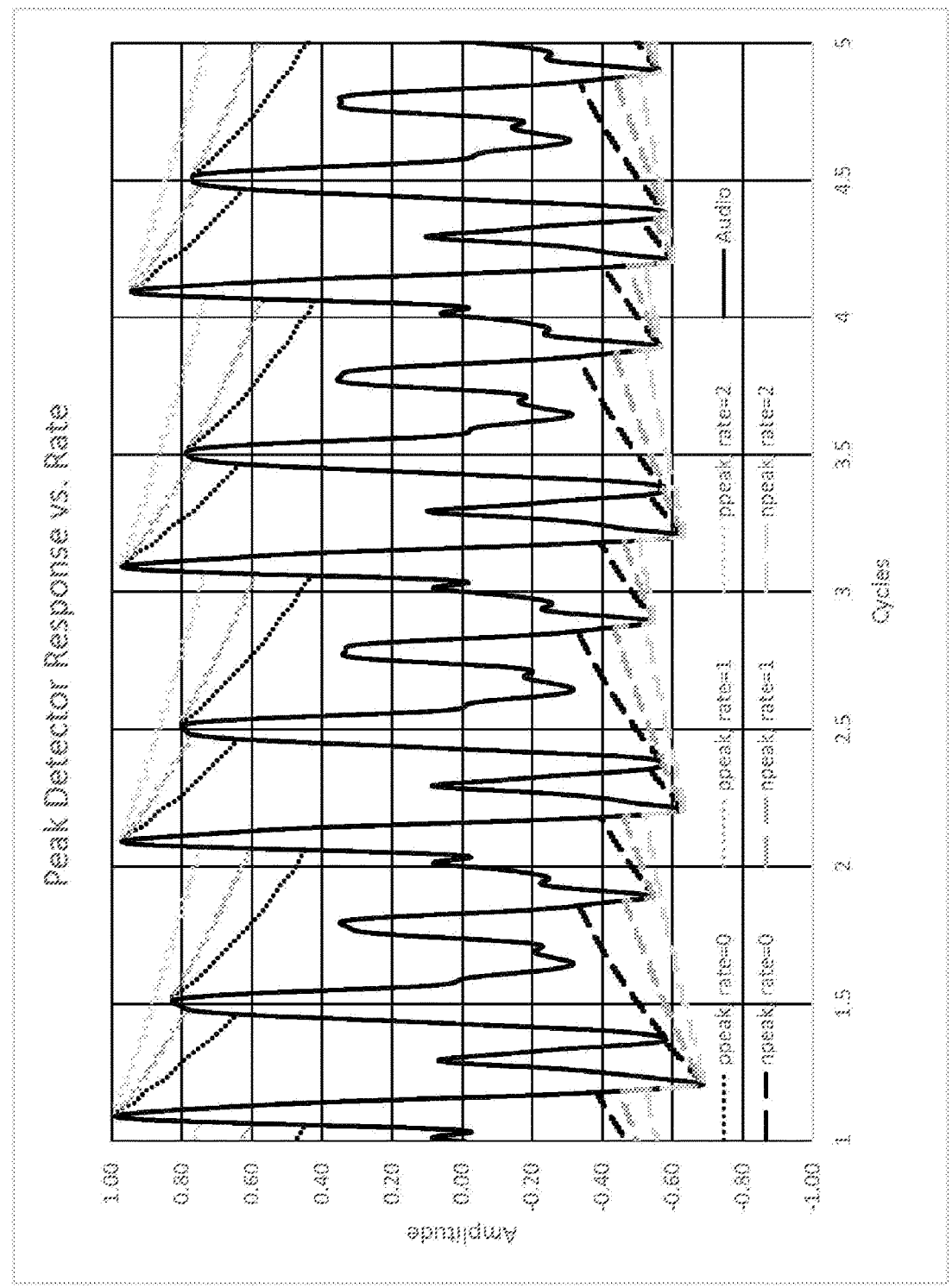
FIG. 5 is a graph of an audio signal with strong harmonic components (in this case, from a violin playing the lowest open string, a G3, with a fundamental frequency of 196 Hz) together with the outputs of the positive peak detector (ppeak) and negative peak detector (npeak) in three different rate modes (rate=0, 1, and 2).

FIG. 5 illustrates graphically the behavior of the peak detector with frequency-dependent decay time for three different rates with a particularly difficult input signal, a violin playing the low G open string (196 Hz). Four cycles of the input waveform are shown; however, it is apparent from the audio signal that the harmonics cause waveform activity that can very easily fool the harmonic detection circuit into thinking the fundamental frequency is twice as high as it actually is. In particular, the mini-peaks at 1.5, 2.5, 3.5, and 4.5 cycles, if detected, will cause the FLL to lock to the second harmonic of this signal. Also shown are the positive and negative peaks ppeak and npeak for three different rates, 00, 01, and 10. It is apparent from the graphs that for rate=00 or 01, the second harmonic of the signal will be detected, whereas for rate=10 or higher, the true fundamental frequency will be detected. Note that it doesn't matter that multiple negative peaks are still detected between positive peaks for rate=10 and higher because the SR latch in FIG. 2 simply holds its state when multiple peaks of the same polarity are detected with no intervening peaks of the opposite polarity.

The time period between successive peak decay events is thus variable, so that the time period can be set long enough to avoid locking to a second or a higher harmonic depending on an instrument producing the input signal, but no longer than necessary to prevent cycle skipping when the audio signal decays.

It should be stated that there is a tradeoff between harmonic rejection and transient response using peak detectors with frequency-dependent decay time to detect the fundamental frequency of an audio signal. If the rate is set very high to reject very high harmonic energy, when the signal decays it is possible to MISS audio cycles as the signal can decay faster than the peak is decaying. For this reason, it is advisable to set the rate just high enough to avoid locking to the second (or a higher harmonic) depending on the instrument, but not higher than necessary to prevent cycle skipping when the audio signal decays. Bowed string instruments, for example, will require a higher rate setting and voices with lower harmonic content such as guitar and voice can generally function well with the rate set lower.

Figure 6:
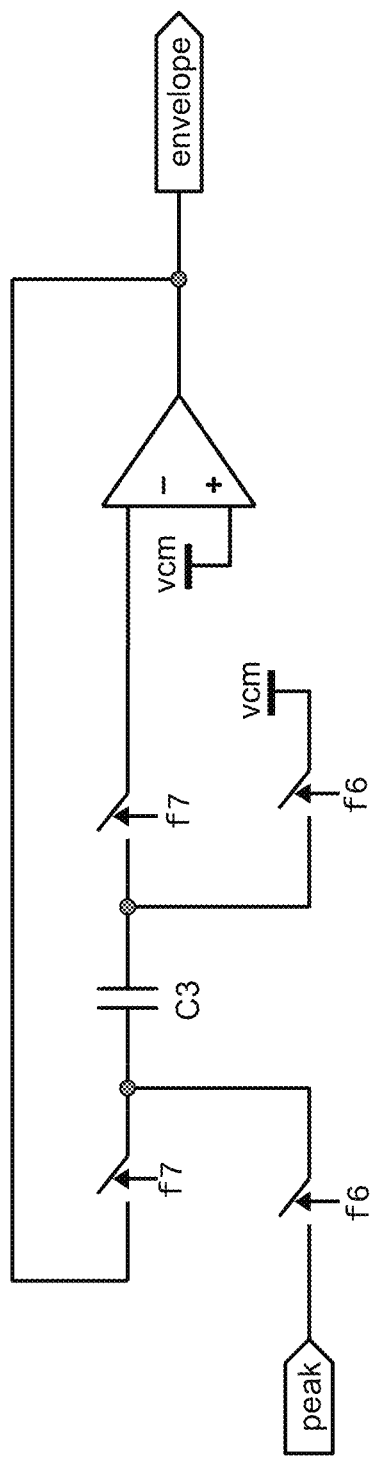
FIG. 6 is a schematic of a zero-ripple envelope detector consisting of a sample-and-hold amplifier with sample and hold phases selected to give an output representing a zero-ripple envelope signal based on the audio input.

The rest of FIG. 4b and FIG. 6 illustrate an additional benefit that can be achieved with this disclosure for very little extra effort. Referring to FIG. 4b, D flip-flop 470, AND gate 471 and inverter 460 generate a positive pulse at the output of AND gate 471 whenever there is a negative edge detected on the "comp" input. This means the audio input is no longer higher than the peak hold signal and therefore the peak signal can be understood to represent the true "peak" of the audio signal over the past cycle. In connection with this, 5-input AND gate 455 generates a positive pulse whenever count<0> through count<13> are all high; in other words, every TWO audio cycles (since the 14-bit counter takes two audio cycles to come back to the all zeroes state). The output of AND gate 455 and the output of the negative "comp" edge detector from AND gate 471 are or'ed together with OR gate 475 and the result is used to generate an additional pair of clock phases, $\phi 6$ and $\phi 7$ using D flip-flip 472, AND gate 473 and inverter 474 in an analogous way to the generation of $\phi 4$ and $\phi 5$. These new phases $\phi 6$ and $\phi 7$ are used to clock a sample and hold amplifier that takes the peak hold signal as its input as shown in FIG. 6. FIG. 6. shows a standard switched capacitor sample-and-hold circuit which is not novel—the novelty in this disclosure is in how the phases for sample and hold are generated based on the state of the comparator 340 and 14-bit counter 420. The output of this sample-and-hold amplifier is labeled "envelope." When peaks are detected, the maximum peak value is transferred to the "envelope" output whenever the "comp" signal transitions from high to low. Finally, to allow this envelope signal to decay, it samples the decaying peak signal every TWO audio cycles after peaks stop being detected. An additional switched-capacitor filter can be implemented to smooth out the envelope signal to avoid abrupt jumps in its value, but such filters are well known in the art and it is therefore not necessary to describe them in detail in this disclosure. The result of this final sample-and-hold circuit, plus optional switched-capacitor filtering, which is not described herein, is a true ZERO RIPPLE envelope signal derived from an audio input, which is very useful for music synthesis applications. For example, if the detected envelope of an audio signal is used to control the amplitude of a sine wave, any ripple in the envelope is immediately audible as distortion in the sine wave. It is notoriously difficult to generate low ripple envelope signals, especially when the input frequency is very low. This zero-ripple envelope detection technique can be used to avoid filtering of the envelope ripple, which also causes unwanted slowness in the transient behavior.

Figure 7:
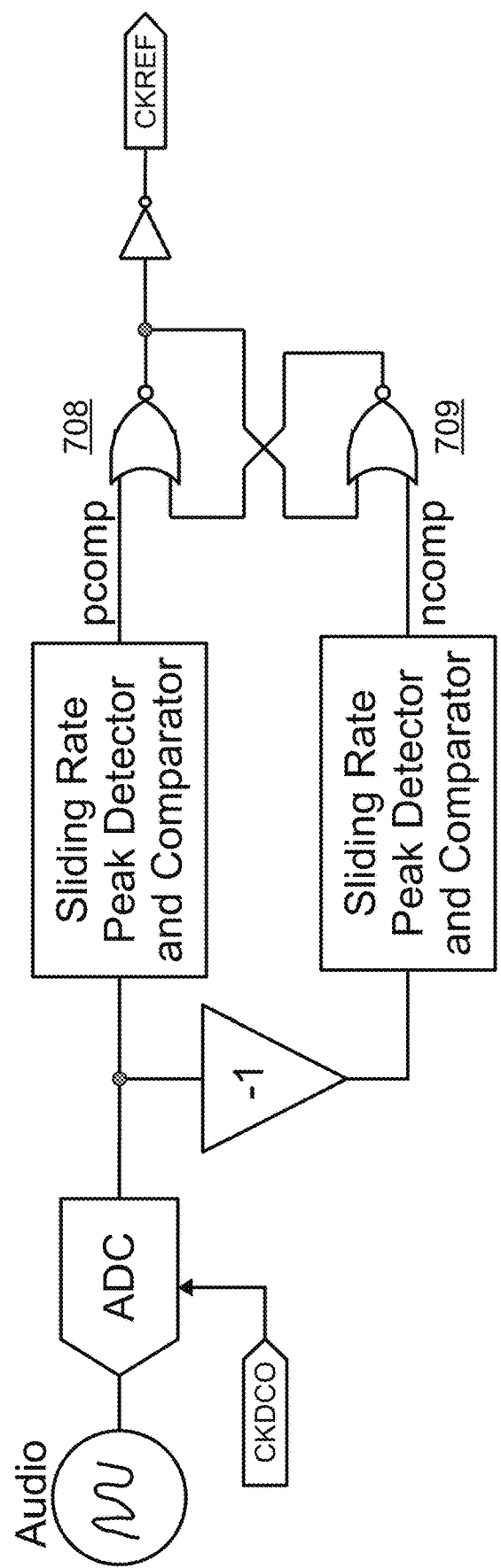
FIG. 7 is a block diagram of the more digital version of the fundamental frequency detection circuit comprising an analog-to-digital converter (ADC) followed by two peak detectors, one of which processes the inverted version of the ADC output signal, and logic gates implementing an SR latch, where the sample rate is proportional to the fundamental frequency of the incoming audio signal and the signal CKREF 250 serves as the Reference Frequency 102 input in the larger system.

The remainder of this disclosure concerns two other embodiments of the dual peak detector with decay time proportional to the fundamental period of the audio signal which transfer successively more of the analog circuits described above into the digital domain. The first of these two embodiments digitizes the audio using the sliding clock CKDCO which runs at 8,192 times the fundamental frequency of the audio (or an integer divisor thereof) and duplicates exactly the analog peak detection functions in the digital domain. This implementation is fairly straightforward, and it overcomes the DC offset problem described above because the one and only one DC offset in this digital system is at the ADC input and can therefore be ignored. FIG. 7 illustrates this digital sliding-rate fundamental frequency detection circuit. It differs from the original analog implementation by inserting an ADC (analog-to-digital converter) before the dual peak detectors, which are implemented digitally.

Figure 8:
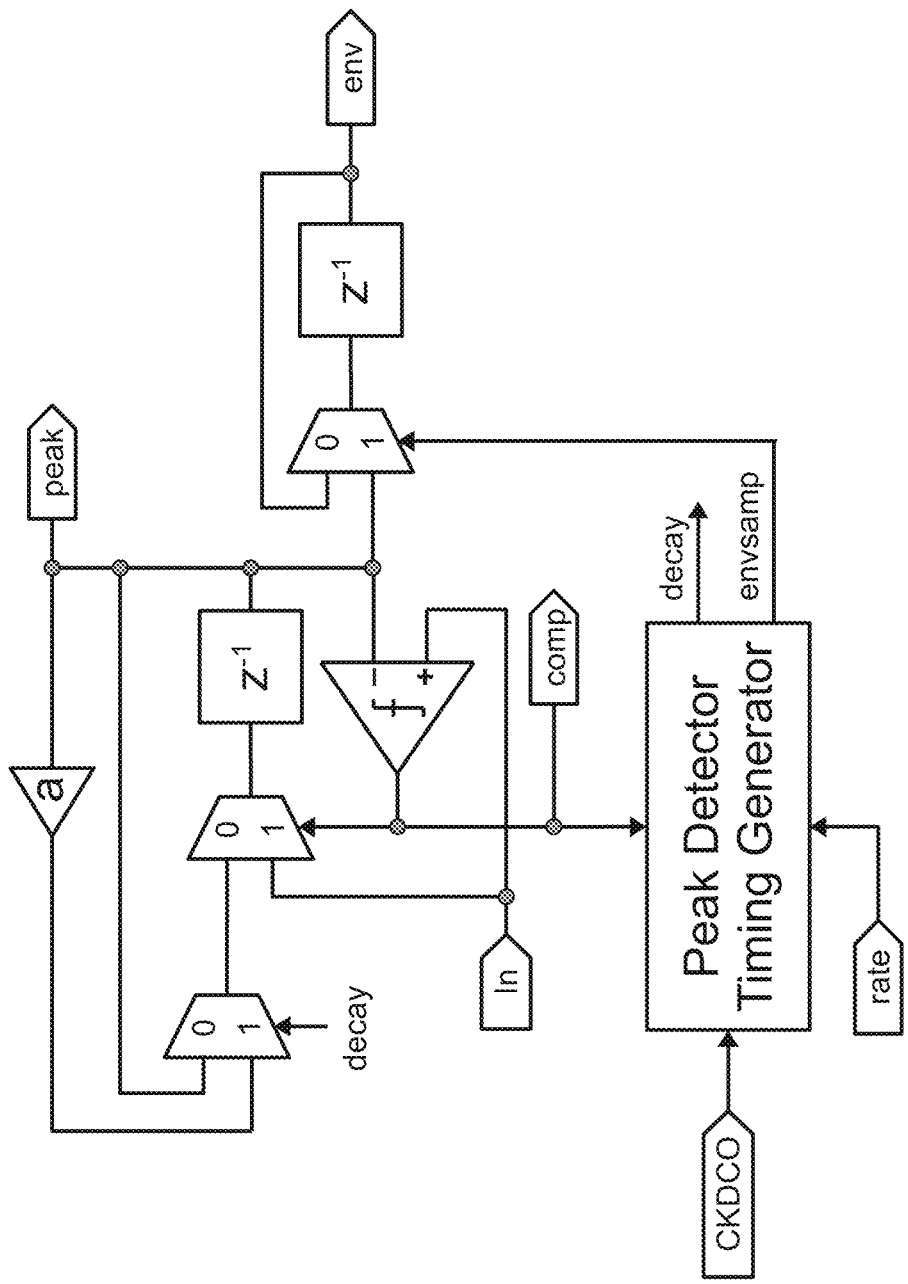
FIG. 8 is a signal flow diagram of a digital peak detector with sliding sample rate, exhibiting the same time-domain characteristics as the analog peak detector of FIG. 2.

Implementation of each peak detector for the sliding-rate digital version of this disclosure is illustrated in FIG. 8. The "peak" value is stored in a memory represented by a delay element "$z^{-1}$" and this peak value is compared with the digitized input "In" on every cycle. If the value at "In" is greater than the current peak value, the mux selects "In" on the next cycle and it gets stored as the "peak" value for that cycle. If "In" is less than "peak," either the "peak" value is held or, if the appropriate number of cycles has elapsed and the value of "decay" is 1, an attenuated version "a*peak" is stored as the next "peak" value, where a<1 and determines the time constant of decay.

When the peak detector timing generator logic detects that the audio waveform has just passed its crest, it enables the "envsamp" signal to transfer the current value of "peak" to the "env" output, which is otherwise held at a fixed value. The output of the comparator is used as the clock pulse into one input of the SR latch composed of cross-coupled NOR gates 708 and 709 in FIG. 7.

The sliding-rate digital implementation of the fundamental frequency detector based on dual peak detectors with decay time proportional to the fundamental period of the audio signal solves some practical problems affecting the analog implementation of this disclosure; however, sliding rate digital processing does not really lend itself easily to integration in common systems such as DSP, microprocessors or countless software-based systems, which all perform calculations on the clock ticks of oscillators running at a fixed frequency. For this reason, an embodiment of this disclosure is desired which can be implemented in a fixed-sample-rate system.

Figure 9:
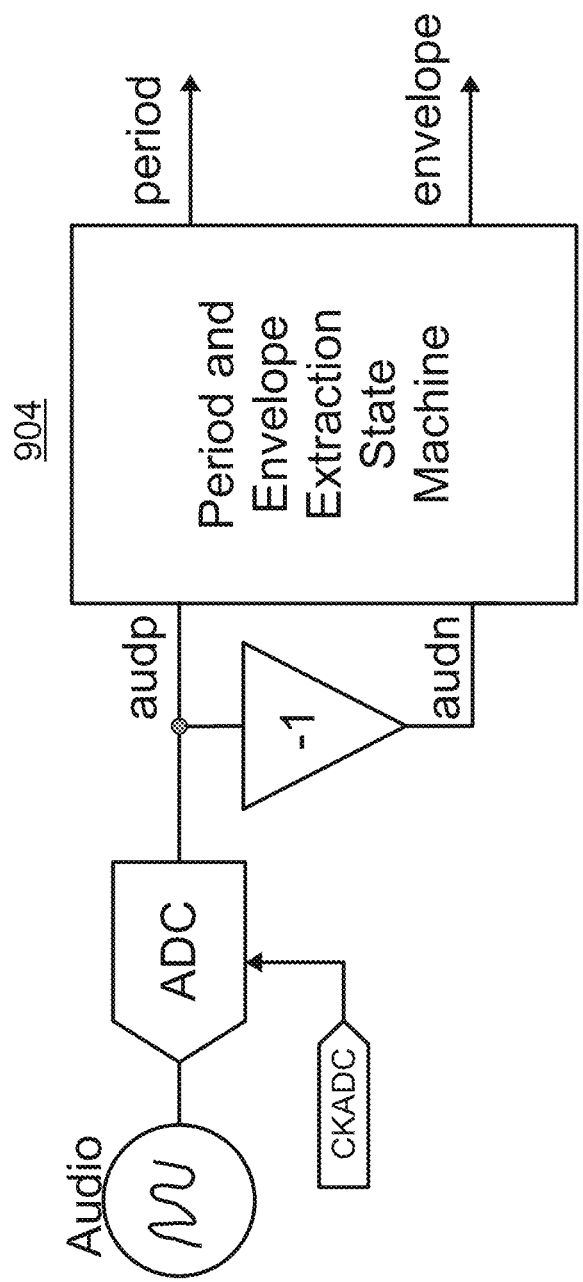
FIG. 9 is a completely digital embodiment of a fundamental frequency and envelope detection circuit where substantially the same behavior as in the original analog embodiment and the aforementioned digital sliding sample rate embodiment is achieved using a fixed sample rate and a state machine.

The final and most "digital" way to implement the dual peak detector fundamental frequency detection method to be described in this disclosure is with an ADC clocked at a fixed rate and a state machine which can process the audio signal digitally and extract its period and envelope. This method is considered the most versatile as it can be implemented on a wide variety of computational platforms, from a micro-controller or DSP to software running inside a mobile application. FIG. 9 illustrates this digital fixed-rate fundamental frequency detection circuit at a very high level. This all-digital version of the disclosure illustrated in FIG. 9 provides two peak detectors working simultaneously all the time to guarantee that two successive peaks can be detected of a given polarity with at least one peak of opposite polarity between them.

The fully digital version of the fundamental frequency detection method using dual peak detectors also relies on detecting the positive and negative peaks of the input audio signal, as in the other two versions, and adjusting the decay time constant of these peak detectors each time it updates the fundamental frequency estimate. If the positive peaks are in general stronger than the negative peaks, the period of the waveform is judged to be the time measured between successive positive peaks, provided that a negative peak has been recorded between those positive peaks. Enforcing this sequence takes the place of the SR latch shown in FIGS. 2 and 7 of the other two versions of the invention. Conversely, if the negative peaks are in general stronger than the positive peaks, the period of the waveform is judged to be the time measured between successive negative peaks, provided that a positive peak has been recorded between those negative peaks. This arrangement is necessary because two positive peaks without an intervening negative peak cannot be considered a valid "cycle" of the audio signal and would therefore yield an incorrect frequency estimate.

Figure 10:
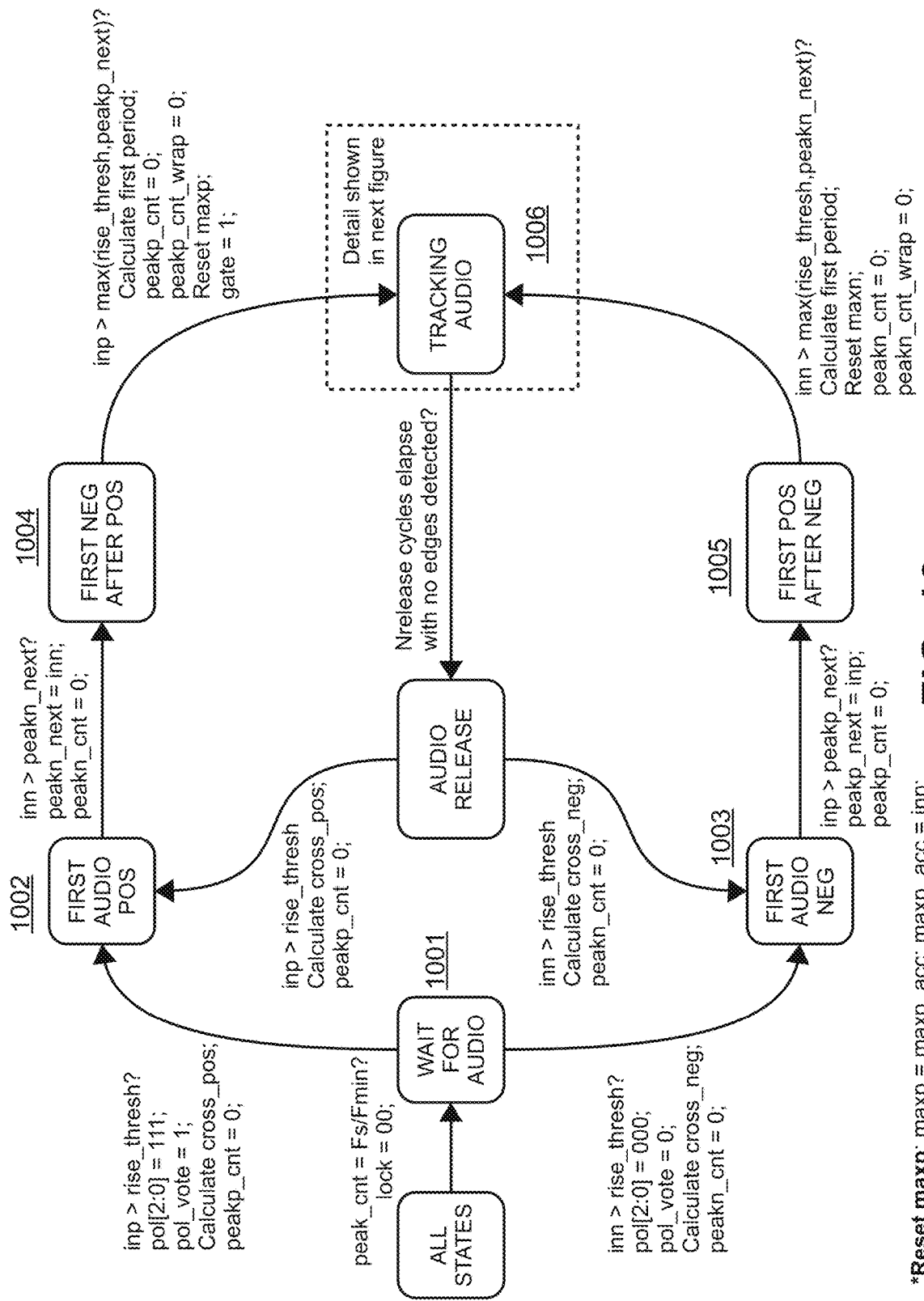
FIG. 10 is a state transition diagram illustrating the behavior of the fundamental frequency and envelope detection state machine of FIG. 8.

FIG. 10 shows a state transition diagram for the state machine 904 illustrated in FIG. 9. The operation of the state machine can be understood as follows. The state machine begins operation in the "WAIT FOR AUDIO" state 1001. Here, the audio input is monitored until either the positive input (inp) or the negative input (inn) exceeds a user-defined threshold (known in the synthesizer art as the "gate threshold" and called "rise_thresh" in this disclosure for simplicity). The negative input inn is simply the inverse of inp and can be computed using signed arithmetic.

If the positive input inp exceeds the threshold "rise_thresh" first, the state machine decides that the polarity of the audio signal is positive (pol[2:0]=111 and pol_vote=1) and control is passed to the "FIRST AUDIO POS" state 1002. Additionally, the precise time at which the input crossed the threshold is calculated using linear interpolation between the current and the previous audio samples and the timer "peakp_cnt," which will count the number of samples between two positive peak detection events, is reset. Conversely, if the input inn exceeds "rise_thresh" first, the state machine decides that polarity of the audio signal is negative (pol[2:0]=000 and pol_vote=0) and control is passed to the "FIRST AUDIO NEG" state 1003. The time at which the audio signal crossed the threshold is calculated as above and the timer "peakn_cnt" is reset to count the number of samples between negative peaks in the waveform. The details of calculating the exact threshold crossing time are presented below where the period calculation is described in greater depth. Note that a different threshold "fall_thresh" will be used to detect that a note has stopped playing. This threshold will generally be lower than the "rise_thresh" threshold to give the system hysteresis and improve immunity to random variations that will occur in the heights of signal peaks as an audio signal decays.

In the "FIRST AUDIO POS" state the state machine monitors the negative input inn until it exceeds the decaying value of the negative peak detector. When this happens, the peakn_cnt counter is reset and control is passed to the "FIRST NEG AFTER POS" state 1004. Conversely, in the "FIRST AUDIO NEG" state the positive input inp is monitored until it exceeds the decaying positive peak detector signal, at which point the peakp_cnt counter is reset and control is passed to the "FIRST POS AFTER NEG" state 1005.

Note that the state machine is required to generate an estimate of the period of the audio signal. This period is assumed to be known a priori; however, since the period cannot be known in the beginning before an audio signal occurs, it is necessary to initialize the period to some convenient value. A value representing the minimum frequency (maximum period) which can be tracked is recommended, although this value is not critical, as it will be corrected on the first period of the incoming audio signal.

Figure 11:
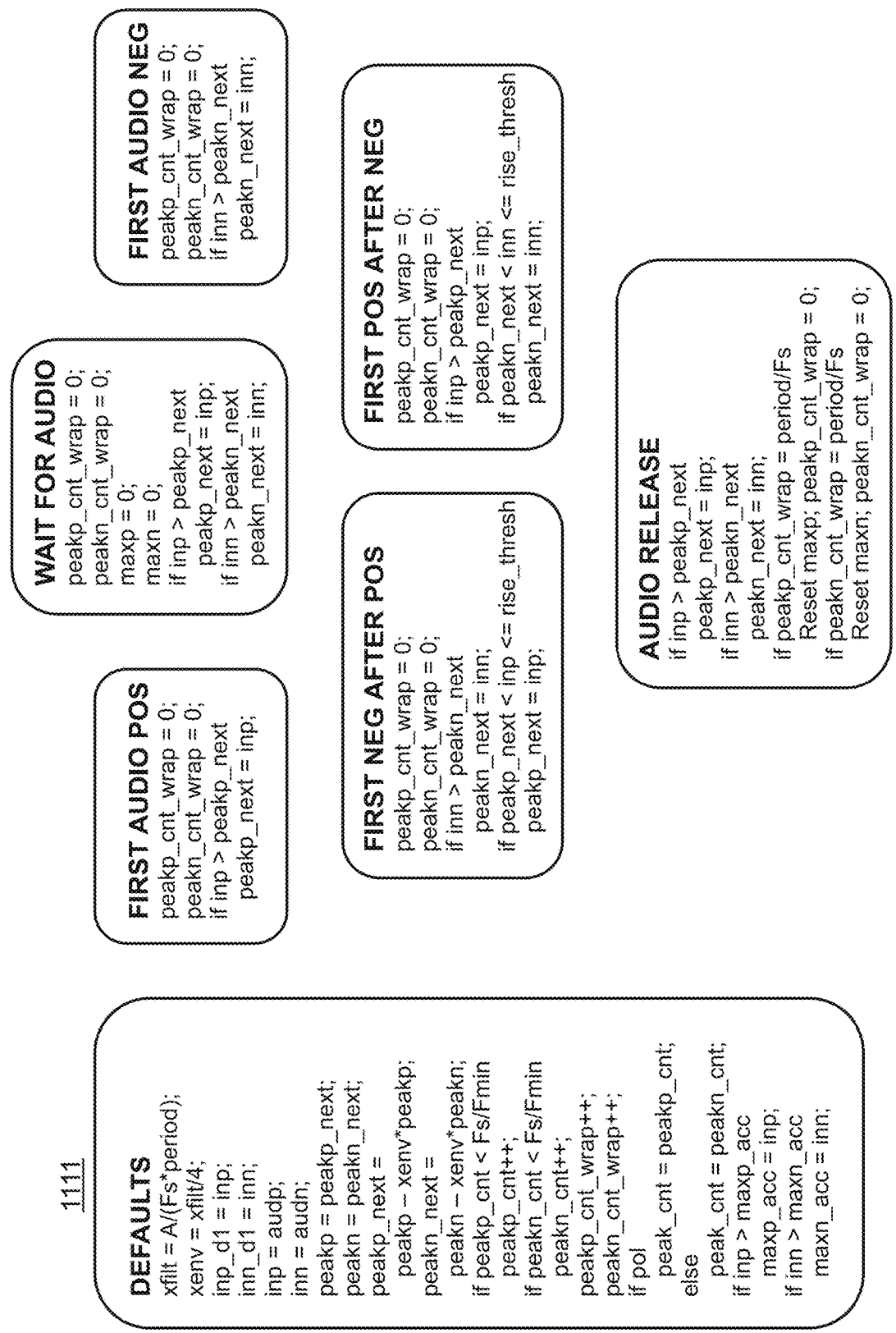
FIG. 11 shows pseudo-code for the six simplest states in the state machine—WAIT FOR AUDIO, FIRST AUDIO POS, FIRST AUDIO NEG, FIRST NEG AFTER POS, FIRST POS AFTER NEG, and AUDIO RELEASE, as well as the DEFAULT operations performed on each clock cycle in the state machine.

At this point it is convenient to take a detour to the DEFAULTS operations 1111 shown in FIG. 11. These operations occur on every cycle and in every state of the state machine. First, note that two filtering constants are calculated based on the current value of the waveform period (this is why it is critical to define the waveform period even before any audio signal has been detected): "xfilt" is one of the coefficients of an IIR (infinite impulse response) filter which smooths out the envelope outputs for waveform polarity detection and for conversion to an analog "envelope" signal as in the first embodiment. The value of "xfilt" is a constant A divided by the product of the sample rate Fs and the detected period. The other filtering time constant is "xenv" and it is recommended to be a factor of 4 smaller than xfilt, although other factors besides 4 should be considered acceptable embodiments of this disclosure. Using filter coefficients which are inversely proportional to the detected period is the key to making the fixed-rate peak detector and envelope smoothing filter respond with time constants proportional to the period of the detected audio signal and will be justified below.

Next in the DEFAULTS we see that the state machine must delay the inputs inp and inn by one cycle and store these quantities as inp_d1 and inn_d1. These delayed versions of the inputs are needed for interpolating the precise time at which the analog waveform crossed the peak detection threshold. The peak detector quantities are then updated so that the current value of the positive and negative peaks (peakp and peakn) are assigned their "next" values (which are calculated at the end of each state) and the peakp_next and peakn_next values are assigned as follows: peakp_next=peakp−xenv*peakp, peakn_next=peakn−xenv*peakn. Because the positive and negative peak values are updated in this way, where xenv is inversely proportional to the detected period of the audio signal, these peak detectors will decay with a time constant proportional to that period as was achieved in the analog implementation of this disclosure as well as the sliding-sample-rate digital implementation described herein. This can be seen from the following equations:

$$xenv = \frac{A}{4F_s * \text{period}} \quad (1)$$

$$peakp[n] = peakp[0]\left(1 - \frac{A}{4F_s * \text{period}}\right)^n \quad (2)$$

Note that if a full cycle elapses between the peakp[0] and peakp[n] sample, n will be precisely equal to Fs*period and Eq. (2) can be rewritten:

$$\frac{peakp[n]}{peakp[0]} = \left(1 - \frac{A}{4n}\right)^n \quad (3)$$

The limit of this expression as n gets very large is a well-known result of limit theory:

$$\lim_{n \to \infty}\left(\frac{peakp[n]}{peakp[0]}\right)^n = \lim_{n \to \infty}\left(1 - \frac{A}{4n}\right)^n = e^{-\frac{A}{4}} \quad (4)$$

This guides us to a selection of something close to A=4 for the fastest peak decay time constant (where the peak will decay to about 37% of its initial value in one cycle) and lower numbers for slower peak decay behavior. Note that the exponential approximation gives an error of less than 5% if n>10, which is a reasonable lower limit on n (for $F_S$=48 kHz this limit applies for audio frequencies as high as 4.8 kHz).

The remaining pseudo-code instructions grouped into these DEFAULTS will be described later when relevant. Returning to the state transition diagram of FIG. 10, the remaining instruction executed when leaving either the FIRST AUDIO POS or FIRST AUDIO NEG states can be understood now. If the negative input inn is greater than the next peakn value peakn_next, the peakn_next value will be assigned to inn instead of the decayed previous value of peakn, as expected with a peak detector. An analogous situation occurs with peakp when leaving the FIRST AUDIO NEG state.

To leave the FIRST NEG AFTER POS state 1004, the positive audio input inp must return to a value high enough to be considered the next positive peak of the audio signal. This value will be the maximum of either rise_thresh or the value peakp_next which peakp will decay to on the next cycle. When inp exceeds the maximum of rise_thresh or peakp_next, the state machine calculates the time at which the waveform crossed either the state threshold or the decaying peak and uses this information to calculate the first period estimate. In addition, the state machine can generate a positive "gate" signal at this point, which is required by some analog synthesizers as an indication that a note has been played.

To enable tracking of the audio signal amplitude, the state machine keeps track of quantities maxp_acc and maxn_acc which represent the running maximum values taken by the inp and inn signals respectively over a certain period of time. The intent of the envelope estimator is to calculate the maximum values of inp and inn over exactly one cycle. The period estimate, along with counters peakp_cnt_wrap and peakn_cnt_wrap, are used to reset the max hold values maxp_acc and maxn_acc and whenever one of these quantities is reset, the accumulated maximum it currently stores will be transferred to the quantity maxp or maxn. These quantities maxp and maxn may be optionally filtered using standard digital filtering techniques or may use filter coefficients that are adjusted on each cycle to give a filter time constant which remains proportional to the audio signal period. Optionally, the state machine may calculate the RMS (root-mean-squared) value of the waveform over the duration of each cycle or may use any other amplitude estimation metric, and this quantity may be used as an envelope estimate.

Returning to the DEFAULTS executed on each state machine cycle, peakp_cnt_wrap and peakn_cnt_wrap are each incremented by one on each cycle. Also, the maxp_acc/maxn_acc quantities are updated if the new value of inp/inn is greater than the currently maximum held value since the maxp_acc/maxn_acc quantities have been reset. In this way it can be seen how the envelope estimate also depends on making an accurate estimate of the waveform period. By monitoring both the positive and negative portions of the audio waveform over one cycle and extracting the maximum values (or RMS or other values) taken by each of these waveforms it is possible to extract a very smooth yet accurate and fast representation of the evolving envelope.

Once the second positive (or negative) peak has been detected, the state machine enters the steady-state "TRACKING AUDIO" compound state 1006, which itself is composed of four sub-states: AUDIO POS POL POS, AUDIO NEG POL POS, AUDIO NEG POL NEG, and AUDIO POS POL NEG. These states illustrate that the audio waveform can be both positive or negative, and the detected polarity of the waveform (whether the positive or negative peaks are larger over a significant enough sample of peaks) can be both positive or negative as well, independent of the instantaneous waveform polarity. When the waveform polarity is positive, the state machine will only utilize positive peaks for generating period estimates; conversely, when the waveform polarity is negative, the state machine will only utilize negative peaks for generating period estimates.

When the second positive (or negative) peak is detected and the state machine enters the "TRACKING AUDIO" compound state, the following events occur: (1) The first period is calculated, details of which will be provided later; (2) The peakp_cnt/peakp_cnt_wrap or peakn_cnt/peakn_cnt_wrap (depending on the detected waveform polarity) counters are reset to zero; and (3) the appropriate maxp or maxn quantity is reset, meaning that maxp or maxn is assigned to the current value of maxp_ace or maxn_acc and maxp_ace or maxn_acc is assigned to the current value of inp or inn, depending on the detected waveform polarity.

Figure 12:
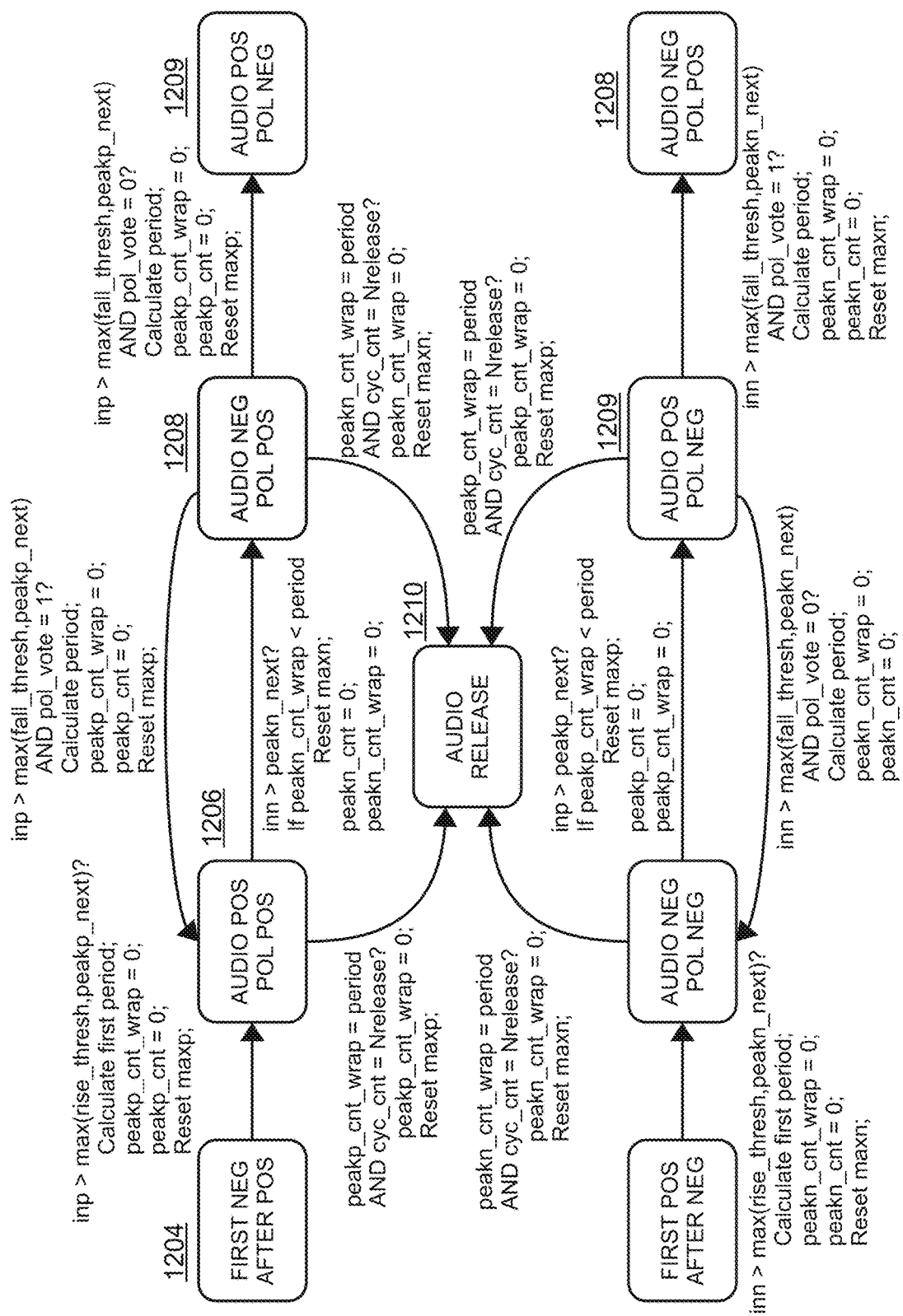
FIG. 12 is an expansion of the compound "TRACKING AUDIO" state from FIG. 10 into sub-states to illustrate the state flow of the fundamental frequency and envelope detection state machine in greater detail.

FIG. 12 illustrates the state machine behavior during the "TRACKING AUDIO" compound state in greater detail. For the sake of simplicity, let's assume the state machine entered the "TRACKING AUDIO" state from the "FIRST NEG AFTER POS" state 1204. In this case, as mentioned above, a positive edge must be detected which is higher than both the rise_thresh value and the peakp_next value which represents the decayed value of the positive peak signal. Then control is transferred to the "AUDIO POS POL POS" state 1206. To exit this state, either (1) a negative edge must be detected (inn must be greater than peakn_next), in which case control will transfer to the "AUDIO NEG POL POS" state 1208; or (2) a user-defined number "Nrelease" cycles (based on the current period estimate) must elapse, in which case the state machine will judge that the audio signal is decaying and control will transfer to the "AUDIO RELEASE" state 1210.

In the "AUDIO NEG POL POS" (and analogous "AUDIO POS POL NEG") states, the state machine allows the polarity to change as follows. The state machine maintains a bit called "pol_vote" which represents a "vote" over the last couple of cycles of whether positive or negative peaks have been larger. The details of this polarity vote will be explained later; for now, it suffices to describe that in the "AUDIO NEG POL POS" state 1208, if the polarity vote decides that the waveform polarity is still positive (pol_vote=1) when the positive audio signal exceeds the maximum of fall_thresh (a different amplitude threshold which is generally LOWER than rise_thresh as explained above) and peakp_next again, control will transfer back to the AUDIO POS POL POS state, a new period will be calculated, the peak counters will be reset, the maxp quantity will be updated, and action will proceed as described above. If however the polarity vote decides that the waveform has negative polarity, the same actions will occur (the period will be calculated, counters reset, maxp updated) but control will pass to the "AUDIO POS POL NEG" state 1209.

In the "AUDIO POS POL NEG" state 1209, the NEGATIVE version of the audio signal must exceed the maximum of fall_thresh or peakn_next in order for the state machine to register an edge, calculate the new period, etc. State machine operation when the signal polarity is voted negative proceeds as described above for the positive polarity operation, except that inp is replaced by inn, peakp_next by peakn_next, peakp_cnt_wrap by peakn_cnt_wrap, peakp_cnt by peakn_cnt, and maxn by maxp.

Figure 13:
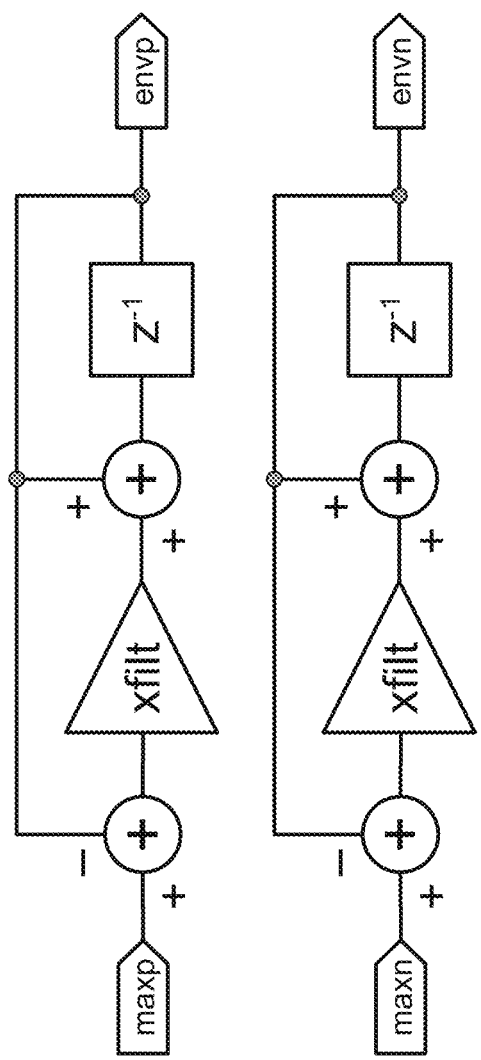
FIG. 13 is one embodiment of a first-order digital low-pass filter to smooth out the positive and negative envelope signals for comparison (to generate the waveform polarity estimate) and for output.

FIG. 13 shows one implementation of a smoothing filter that generates envp and envn signals which can be used to represent the signal envelope. The figures show a simple IIR single-pole lowpass filter whose coefficients are determined by the quantity "xfilt." As described above, xfilt is inversely proportional to the detected waveform period, which gives a filter response whose time constant remains proportional to that period. This is useful for audio signals, in which waveforms tend to decay in a certain number of cycles, independent of frequency, rather than in a certain fixed amount of time.

Figure 14:
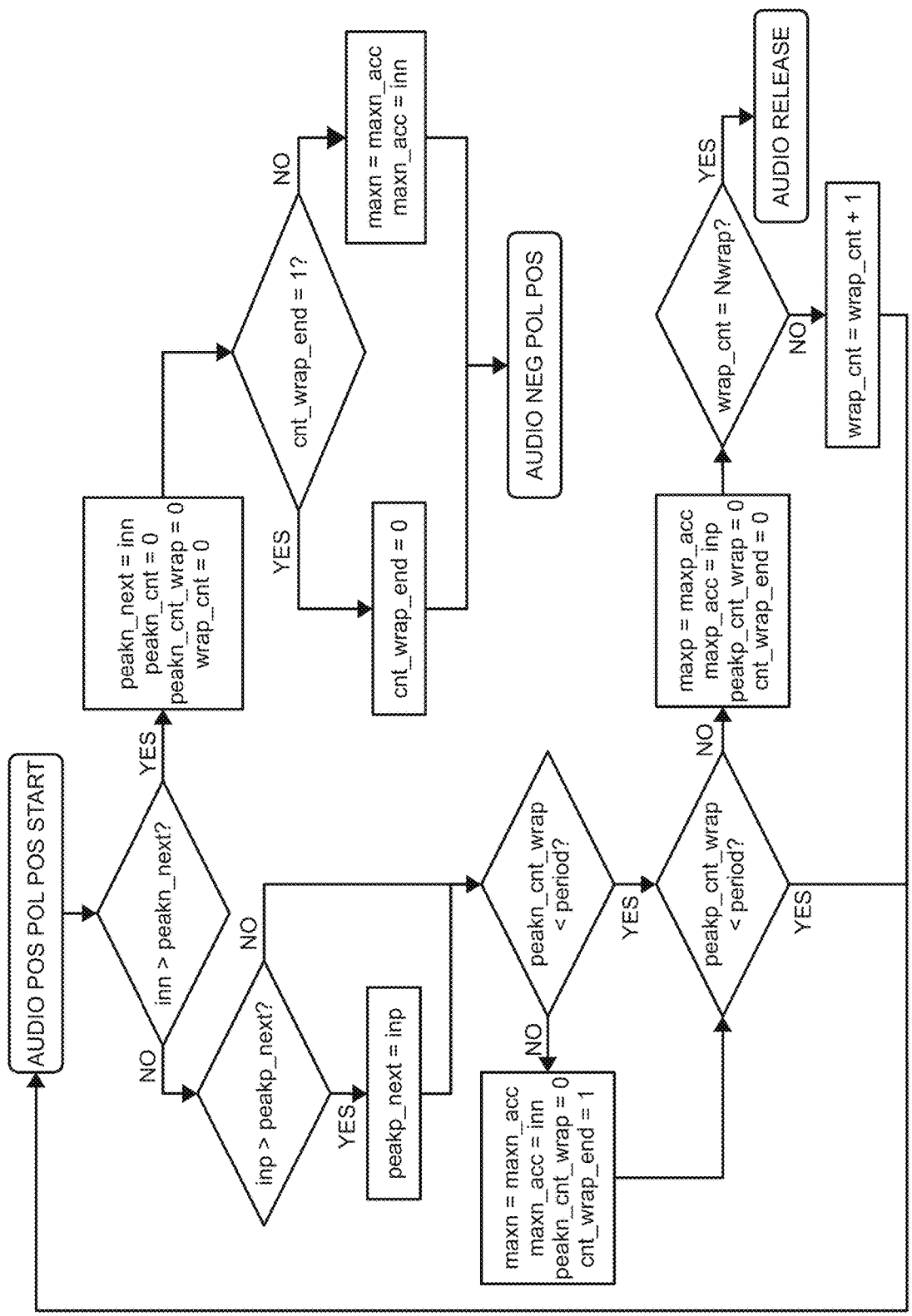
FIG. 14 shows a flowchart for the operations performed in the AUDIO POS POL POS state.

FIG. 14 shows a flowchart of the state machine operation in the "AUDIO POS POL POS" state for greater clarity. First, the state machine detects whether a negative peak has been detected (inn>peakn_next). If such a negative peak has not been detected, the state machine first updates the peakp_next quantity if necessary (if inp is greater than peakp_next, the value of inp will be assigned to peakp_next). Next, if the peakn_cnt_wrap counter value is NOT less than the current period estimate (in other words, it is greater than or equal to the period), the maxn quantity will be updated to the current value of maxn_acc, the maxn_acc quantity will be reset to the current value of inn, the peakn_cnt_wrap counter will be reset to zero and a bit called cnt_wrap_end will be set to one so the state machine will know in the future that the peakn_cnt_wrap timer elapsed and the maxn quantity was updated. This is necessary because if the next negative peak is detected before the peakn_cnt_wrap counter reaches the value represented by the current period (meaning the current period is SHORTER than the last), the state machine will force the maxn quantity to be updated, as will be explained later; whereas if the next negative peak is detected after the peakn_cnt_wrap counter expires (meaning the current period is LONGER than the last), we know that the maxn quantity was ALREADY updated when the peakn_cnt_wrap counter elapsed and we do not want to update it again.

If the peakn_cnt_wrap quantity is less than the current period, the state machine then checks whether the peakp_cnt_wrap counter has elapsed. If not (peakp_cnt_wrap is less than the current period), control flows back to the beginning of the "AUDIO POS POL POS" state. If the peakp_cnt_wrap counter HAS elapsed (peakp_cnt_wrap is greater than or equal to the current period), the maxp quantity will be updated to the current value of maxp_acc, the maxp_acc quantity will be reset to the current value of inp, the peakp_cnt_wrap counter will be reset to zero, and the cnt_wrap_end bit will be set to zero. This event occurs only rarely, since it means that an entire audio period elapsed since the last positive peak was detected without any intervening negative peak. It could mean that the frequency of the audio suddenly decreased within one cycle, or it could mean that the audio signal disappeared completely or is decaying faster than the peak detectors can follow it. All possibilities must be taken into account. Here the state machine makes use of a user-defined parameter Nrelease, which determines how many audio cycles must elapse in the "AUDIO POS POL POS" state without detecting a negative peak before the state machine decides to transfer control to the "AUDIO RELEASE" state. If the peakp_cnt_wrap counter elapsed Nrelease times, the quantity wrap_cnt will be set to Nrelease and control passes to the "AUDIO_RELEASE" state; otherwise, the wrap_cnt quantity is incremented and we return to the beginning of the "AUDIO POS POL POS" state.

Going back to the first decision in the "AUDIO POS POL POS" flowchart, if the negative peak is detected (inn is greater than peakn_next), the next peakn value "peakn_next" will be assigned the negative audio input inn, and the peakn_cnt, peakn_cnt_wrap, and wrap_cnt counters will all be reset to zero. After this happens, if the cnt_wrap_end bit has NOT been set to one (meaning the peakn_cnt_wrap counter did NOT elapse during the "AUDIO POS POL POS" state), the maxn quantity will be assigned the current value of maxn_acc, the maxn_acc quantity will be reset to inn to capture the next peak negative value of the audio waveform, and control will pass to the "AUDIO NEG POL POS" state. If however the cnt_wrap_end bit WAS set to one, it will be reset to zero and control will pass to the "AUDIO NEG POL POS" state without changing the maxn quantity.

Figure 15:
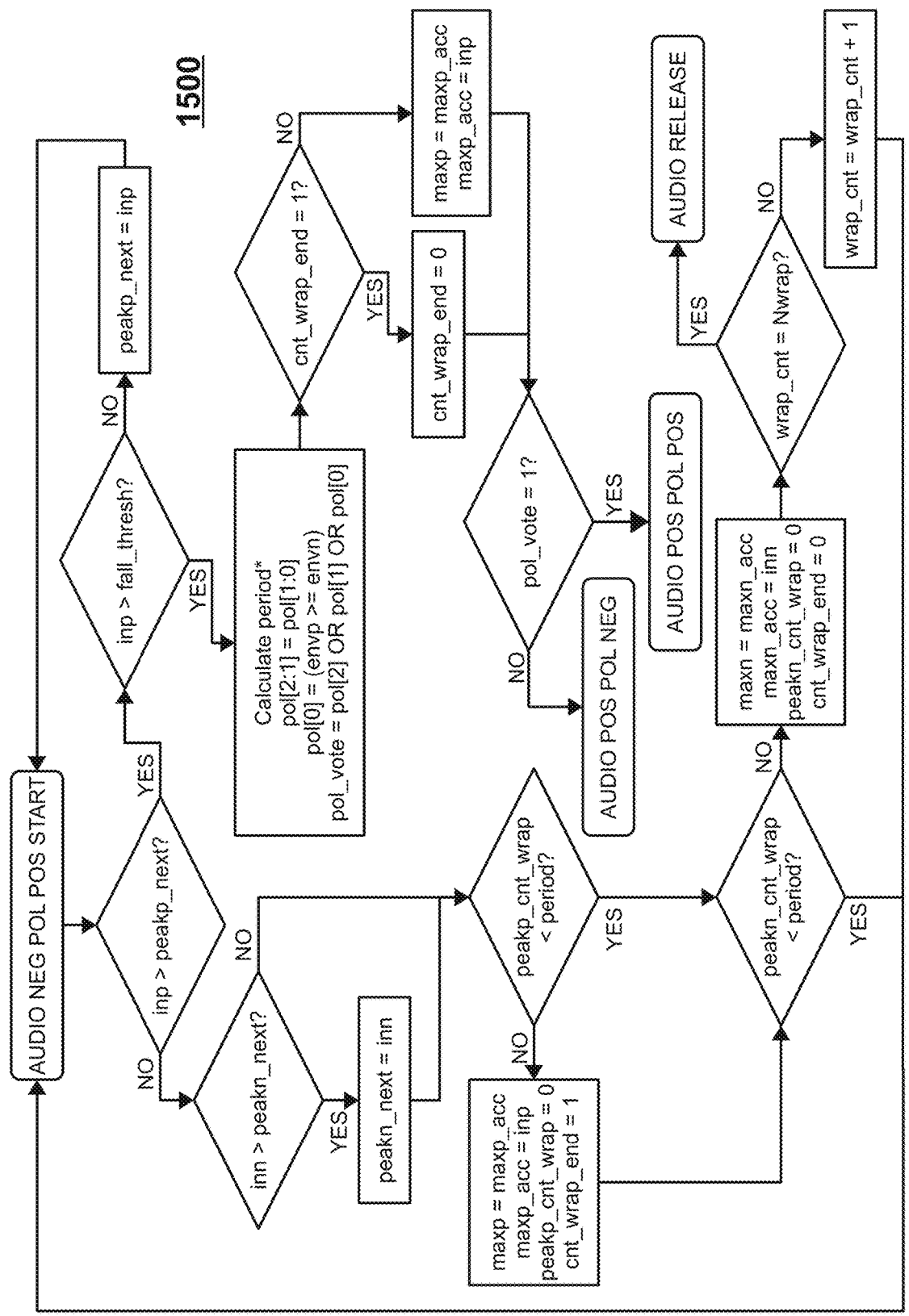
FIG. 15 shows a flowchart for the operations performed in the AUDIO NEG POL POS state.

FIG. 15 shows a flowchart of the state machine operation in the "AUDIO NEG POL POS" state for greater clarity. In this state the state machine monitors the value of the positive audio waveform inp until it exceeds the value of both the decaying positive peak peakp_next and the falling gate threshold value fall_thresh. While the input is below peakp_next, the state machine checks whether the negative audio waveform inn is greater than the negative peak and updates peakn_next if necessary, and also monitors the values of the peakp_cnt_wrap and peakn_cnt_wrap quantities as in the "AUDIO POS POL POS" state, updating the maxp and maxn quantities and cnt_wrap_end bit, and resetting the peakp_cnt_wrap and peakn_cnt_wrap counters as required.

If on the other hand the positive audio input inp is greater than both peakp_next and fall_thresh, a new cycle has been detected for which a new period must be calculated. The period is calculated (details to be provided later), and the pol_vote bit which represents the waveform polarity vote is calculated. The present embodiment computes the instantaneous waveform polarity "pol[0]" by setting pol[0]=1 if the filtered positive envelope quantity envp is greater than or equal to the filtered negative envelope quantity envn, and setting pol[0]=0 otherwise. Meanwhile, the value pol[0] is delayed by one and two cycles, yielding pol[1] and pol[2], respectively. So pol[0], pol[1] and pol[2] represent the current and previous two guesses at the waveform polarity. The pol_vote bit is then set to one if ANY of these three bits, pol[0], pol[1] or pol[2] is positive. This means that three consecutive negative polarity cycles must be observed before the overall waveform polarity is judged to be negative and is meant to keep the pol_vote bit more stable and prevent the polarity from toggling back and forth excessively. Other methods for determining the polarity vote which do not depart from the spirit of the method illustrated should be considered to be within the scope of this disclosure, as there are countless ways in which the polarity vote could be computed and therefore not a fruitful exercise to try to illustrate them all.

If the cnt_wrap_end bit was set to one, similar to the case of the "AUDIO POS POL POS" state, the state machine understands that the maxp quantity has already been updated and will not update it again; if not, it will set maxp to the current value of maxp_acc and reset maxp_acc to inp. Then, depending on the state of the pol_vote bit, control will either pass back to the "AUDIO POS POL POS" state (if pol_vote is one) or to the "AUDIO POS POL NEG" state (if pol_vote is zero).

Figure 16:
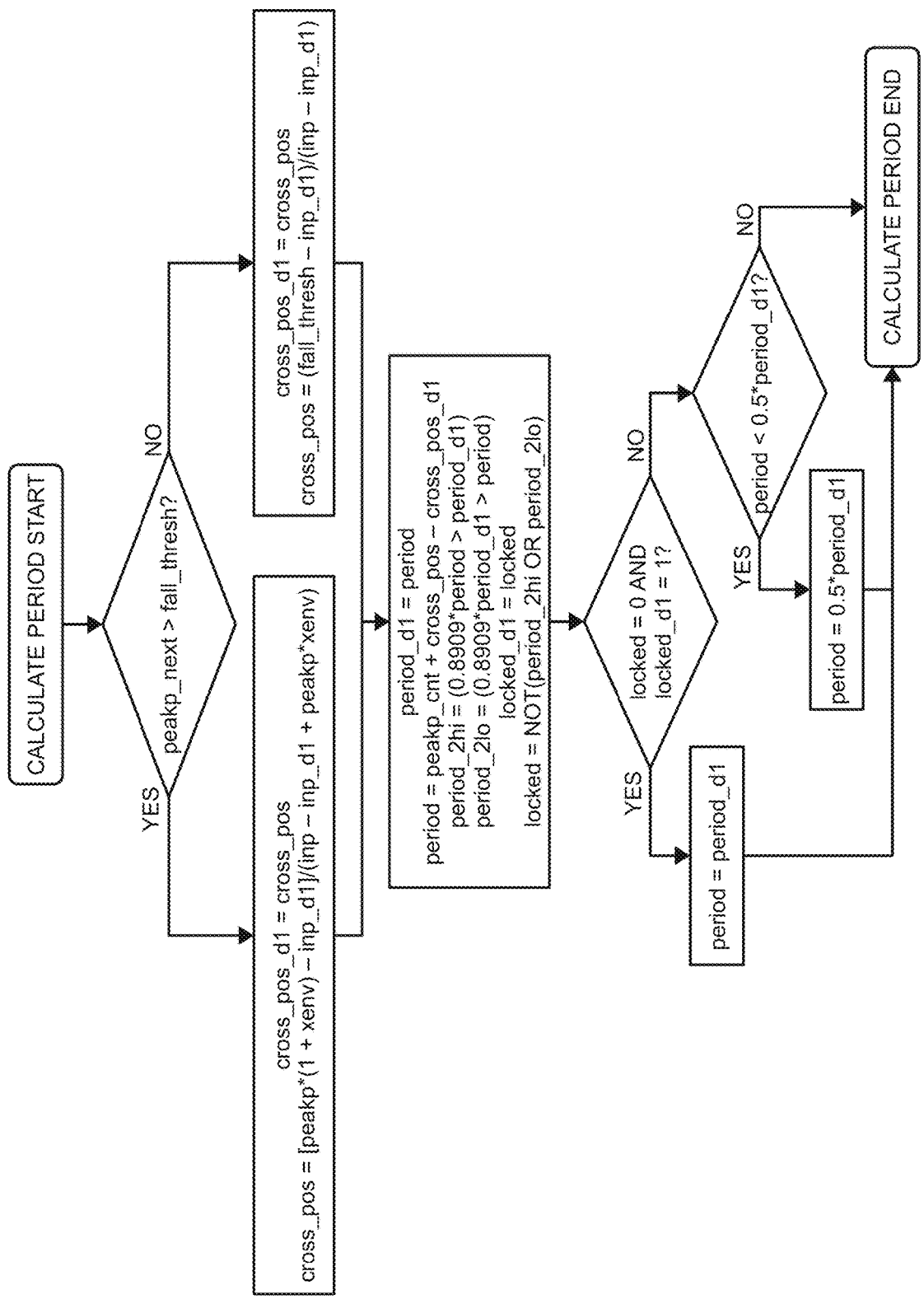
FIG. 16 shows a flowchart for estimating the period of the audio waveform, including a lock detector and logic to "hold" the current period if the audio loses "lock" for one and only one cycle.

Finally, the method of calculating the period of the audio signal will be described, a flowchart for which is shown in FIG. 16. This requires linear interpolation of the audio waveform and the function representing the threshold which the audio crossed (either the flat "thresh" threshold or the falling peak signal) and finding the point in time where they would have crossed. If the peakp_next signal is NOT greater than the thresh quantity, the state machine must calculate where the audio waveform crossed the fall_thresh value. Here, the state machine makes use of a quantity cross_pos, which will represent the fractional part of an audio sample cycle where the crossing occurred. The previous such crossing point will be assigned the value cross_pos_d1 because we need the last crossing point as well to calculate the period. The new crossing point cross_pos is calculated as follows:

$$\text{cross\_pos} = \frac{\text{fall\_thresh} - \text{inp\_d1}}{\text{inp} - \text{inp\_d1}} \qquad (5)$$

where inp is the current value of the positive audio waveform and inp_d1 was the value of the previous sample of the positive audio waveform. If the value of peakp_next was GREATER than the value of fall_thresh, it means the audio waveform has crossed the decaying peakp signal and the following equation must be used to calculate cross_pos:

$$\text{cross } pos = \frac{peakp(1 + xenv) - inp\_d1}{inp - inp\_d1 + peakp * xenv} \quad (6)$$

where xenv is the envelope decay factor computed based on the period of the audio signal as described above. It should be understood that peakp(1+xenv) was the value of the decaying peakp signal on the previous audio sample and peakp*xenv is the amount by which the peakp signal decayed in one audio sample.

Once the current and last fractional waveform crossing times are known, it is a trivial matter to calculate the waveform period. First, a quantity period_d1, which will be used later in making optional corrections to the calculated period, is assigned the last value of the period. Next, the new period is calculated as follows:

$$period = peakp\_cnt + \text{cross } pos - \text{cross } pos\_d1 \quad (7)$$

In other words, the period is equal to the value of the peakp_cnt counter, which was set to zero when the last peak crossing point was detected, plus a correction due to the fractional parts of the current peak crossing time and the previous peak crossing time, in units of audio sample periods.

For some instruments, it is useful to "reject" individual audio cycles that deviate from the general period that has been observed over some history of the waveform. This disclosure proposes one method for rejecting such "deviant" cycles, although those skilled in the art will be able to envision many other such methods. In the present embodiment, the state machine computes two bits called "period_2hi" and "period_2lo." The period_2hi bit will be set if the calculated period seems too high and the period_2lo bit will be set if the period seems too low. The present disclosure uses the criterion that the computed period differs by at least one full step on the 12-tone equal-tempered scale (a factor of about 0.8909), although another interval can certainly be used without departing from the spirit of this disclosure. The state machine then calculates a bit called "locked" which is set if the calculated period is neither too high nor too low (in other words, if the new cycle is within one full step of the previous cycle). The previous value of the locked bit is stored in another bit called "locked_d1" and the state machine utilizes the current and previous "locked" bits as follows: If locked is set to zero and locked_d1 is set to one, meaning that the period was "locked" on the previous cycle and become "unlocked" on the current cycle, the current cycle is judged to be "deviant" and the period is forced to remain equal to period_d1, the period calculated for the previous audio cycle. Otherwise (if the situation locked=0 and locked_d1=1 does NOT apply), this means that either the current and previous locked bits are set, or they are both cleared (and the state machine does not know enough of the history of the signal to know what frequency to expect), or the previous cycle was "unlocked" and the current cycle is "locked." In any of these three cases, the state machine assumes that the calculated period is correct and continues to one last check.

In many cases, it is advisable to not allow the estimated frequency of the audio signal change by more than one octave per audio cycle. If the calculated period of the current cycle comes out shorter than one half of the previous period then (meaning the audio frequency is judged to have jumped by more than a whole octave in one cycle of audio), the state machine forces the period to equal exactly one half of period_d1, restricting frequency jumps within one cycle to one octave above the frequency of the last cycle. These are all the methods implemented for restricting unwanted jumps in period from one cycle to the next in the current disclosure, although other methods can certainly be admitted and should be considered as within the scope of this disclosure.

It should be understood by those skilled in the art that the period can be calculated to any degree of precision, depending on how many fractional bits are used to represent the fractional waveform crossing point between audio samples. It should also be understood by those skilled in the art that the period of the audio signal, once properly computed, can be used in a variety of ways. These ways include but are not limited to: (1) Converting the period to a voltage that represents the audio frequency in an exponential or linear scale to be used for controlling various analog music synthesizers; (2) Utilizing the period to generate an arbitrary waveform tuned in unison to the incoming audio; (3) Utilizing the period to generate an arbitrary waveform tuned to some fixed interval away from the fundamental frequency of the incoming audio; (4) Converting the period along with the measured envelope to a MIDI command for controlling both analog and digital music synthesizers. The methods for performing these operations will not be described in detail because it is considered sufficient for the purpose of this disclosure for the period to be extracted to high enough precision. Methods for performing all of the aforementioned operations and more can be easily deduced by those skilled in the art.

Figure 17:
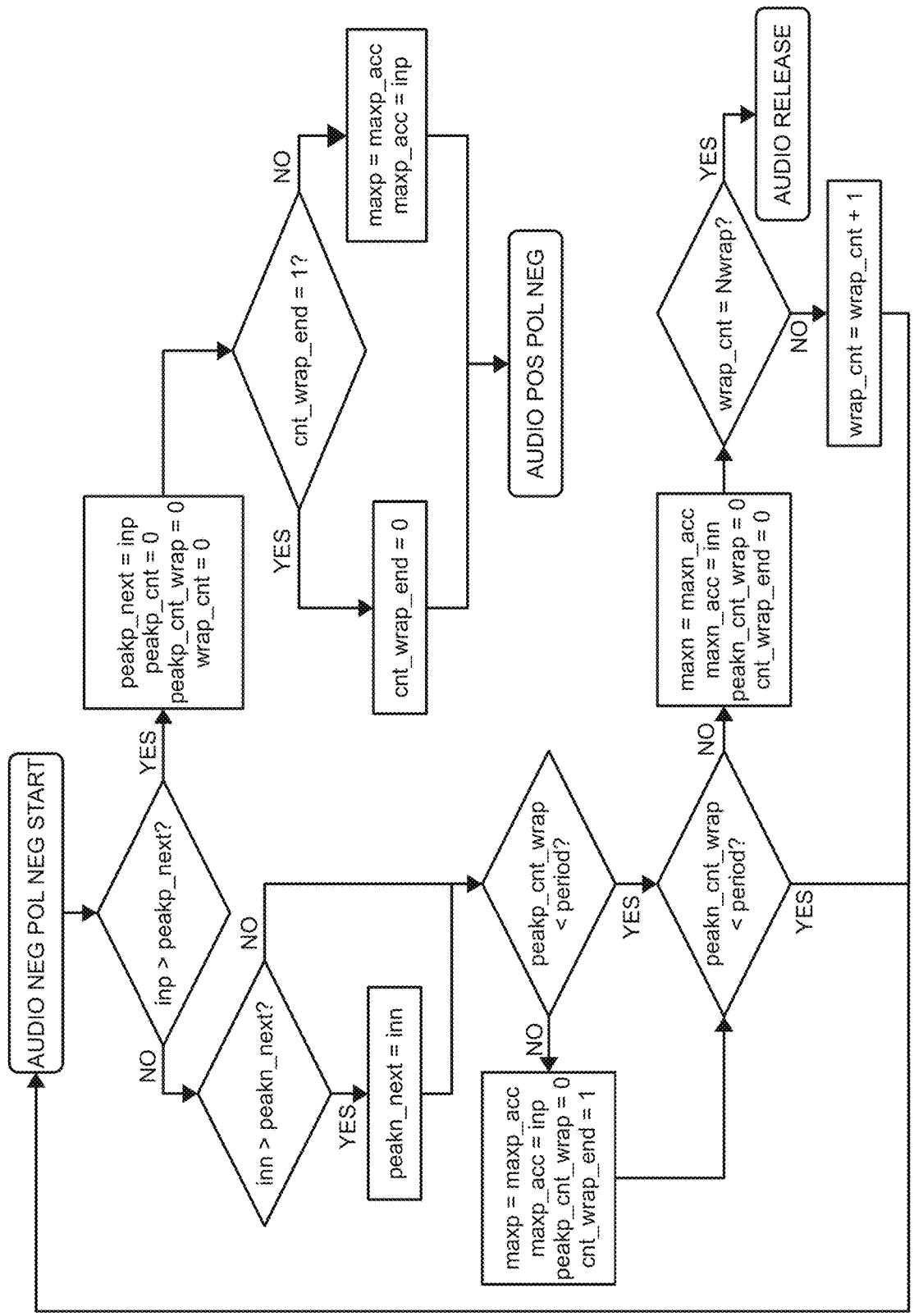
FIG. 17 shows a flowchart for the operations performed in the AUDIO NEG POL NEG state.
Figure 18:
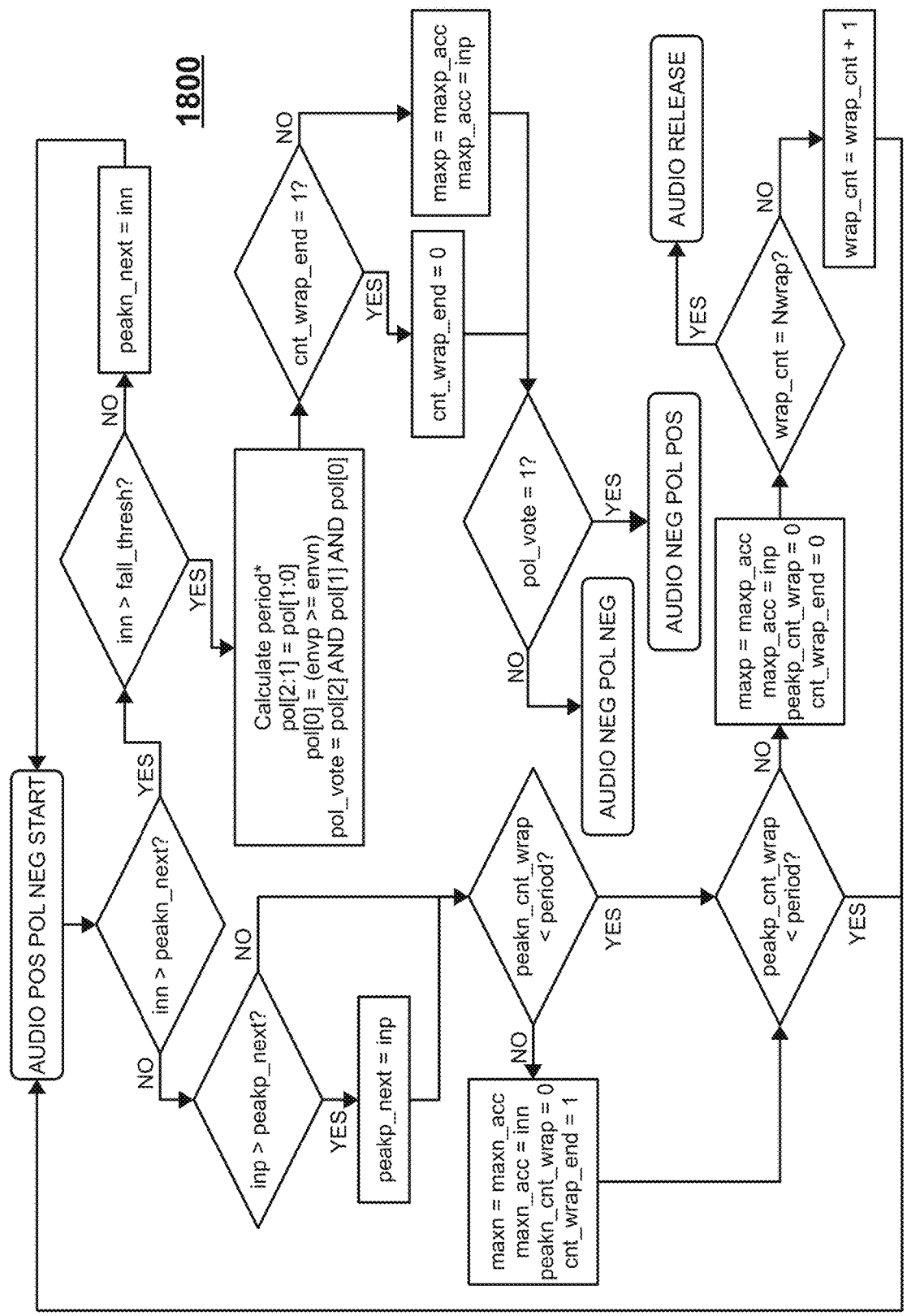
FIG. 18 shows a flowchart for the operations performed in the AUDIO POL POL NEG state.

To conclude the discussion of the compound "TRACKING AUDIO" state, FIG. 17 and FIG. 18 show detailed flowcharts for the "AUDIO NEG POL NEG" and "AUDIO POS POL NEG" states, respectively. These states function similarly to the "AUDIO POS POL POS" and "AUDIO NEG POL POS" states, respectively, except with the positive and negative versions of the audio waveform, peak waveforms, and max quantities interchanged. One difference worth noting is how the pol_vote bit is calculated when the waveform polarity is judged to be negative. In that case, the pol_vote bit cannot get set again until three consecutive polarity estimates pol[0] (where pol[0] is set when envp is greater than or equal to envn) are high. This completes the hysteresis implemented in passing from the pol_vote=1 state to the pol_vote=0 state and back and helps to keep the polarity vote stable. Every other element in FIG. 17 and FIG. 18 will not be described because it is assumed that those skilled in the art can understand the flowcharts based on the discussion of the complementary flowcharts for the "AUDIO POS POL POS" and "AUDIO NEG POL POS" states above.

As mentioned above, if during the "TRACKING AUDIO" state the state machine detects a number "Nrelease" of audio cycles of length corresponding to the currently-detected period, the state machine will assume that the audio has either disappeared or is decaying too quickly to detect any peaks and then enters the "AUDIO RELEASE" state. The operation of the state machine in the "AUDIO RELEASE" state is depicted with sufficient detail in FIG. 11. Using the currently estimated value for the period, the peakp_cnt_wrap and peakn_cnt_wrap counters run while the maxp and maxn quantities, respectively, get updated every time these respective timers expire. This is done so that the envelope signal is still able to track a quickly decaying audio signal even if that signal is decaying too quickly to extract new period estimates on each cycle. Finally, the "gate" output would be set to zero during the "AUDIO RELEASE" state to indicate to a potential analog synthesizer that the detected note has decayed below the gate threshold.

From ANY state, it is possible to return to the "WAIT FOR AUDIO" state if enough time elapses with no positive or negative edges being detected. FIG. 10 illustrates this using the quantity peak_cnt, which is equal to peakp_cnt if pol_vote=1 and peakn_cnt if pol_vote=0. If peak_cnt ever reaches a value corresponding to the audio sample rate Fs divided by the minimum frequency Fmin one wants to detect, the state machine decides that there is no audio signal to be detected and returns to the idle "WAIT FOR AUDIO" state. This "WAIT FOR AUDIO" state should be the starting state when the state machine comes out of reset, and all other quantities including timer counts, peak detector outputs, max hold outputs, etc. should be appropriately initialized on reset.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A method to detect a fundamental frequency of an input signal having at least first and second harmonic components, the method comprising the steps of:
   providing dual peak detectors connected to the input signal to periodically sample a voltage of positive and negative peaks of the input signal, and then
   determining a fundamental frequency of an input signal from an output of the dual peak detectors, a decay time of each of the peak detectors being proportional to a time period between a pair of voltage peaks detected in the input signal,
   wherein the time period between the pair of voltage peaks is used to adjust a decay time constant that determines a decay time for each peak detector,
   wherein the decay time is set to be long enough to avoid locking to the second or a higher harmonic depending on an instrument producing the input signal, but no longer than necessary to prevent cycle skipping when an audio signal decays, and
   wherein the decay time is adjusted so that bowed string instruments can have strong harmonic components at integer multiples of the fundamental frequency of the input signal and therefore require a longer peak detector decay time to avoid locking to these strong harmonics and audio sources with lower harmonic content can make use of shorter peak detector decay times without suffering tracking errors.

2. A method to detect a fundamental frequency of an input signal, the method comprising the steps of:
   providing dual peak detectors connected to an input signal to periodically sample a voltage of positive and negative peaks of the input signal, and then
   determining a fundamental frequency of the input signal from an output of the dual peak detectors, a decay time of each of the peak detectors being proportional to a time period between a pair of voltage peaks detected in the input signal, where an SR latch ensures that a peak of an opposite polarity has been detected between the pair of voltage peaks,
   wherein the dual peak detectors comprise switched-capacitor peak detectors, and
   wherein each peak detector comprises at least one capacitor, six switches for each capacitor, two op amps, and another switched capacitor network containing a different capacitor and four switches, a comparator, and a digital phase generator circuit.

3. A method to detect a fundamental frequency of an input signal having at least first and second harmonic components, the method comprising the steps of:
   providing dual peak detectors connected to the input signal to periodically sample a voltage of positive and negative peaks of the input signal, and then
   determining a fundamental frequency of the input signal from the output of the peak detectors, a decay time of each of the peak detectors being proportional to a time period between a pair of voltage peaks detected in the input signal, where an SR latch ensures that a peak of the opposite polarity has been detected between the pair of voltage peaks,
   wherein the time period between the pair of voltage peaks is used to adjust a decay time constant that determines a decay time for each peak detector,
   wherein the decay time is set to be long enough to avoid locking to the second or a higher harmonic depending on an instrument producing the input signal, but no longer than necessary to prevent cycle skipping when an audio signal decays, and
   wherein the decay time is adjusted so that bowed string instruments can have strong harmonic components at integer multiples of the fundamental frequency of the input signal and therefore require a longer peak detector decay time to avoid locking to these strong harmonics and audio sources with lower harmonic content can make use of shorter peak detector decay times without suffering tracking errors.

* * * * *